United States Patent
Hwang et al.

(10) Patent No.: US 6,724,796 B2
(45) Date of Patent: Apr. 20, 2004

(54) MODIFIED DISTRIBUTED BRAGG REFLECTOR (DBR) FOR VERTICAL CAVITY SURFACE-EMITTING LASER (VCSEL) RESONANT WAVELENGTH TUNING SENSITIVITY CONTROL

(75) Inventors: Wen-Yen Hwang, Sugar Land, TX (US); Klaus Alexander Anselm, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 09/951,087

(22) Filed: Sep. 11, 2001

(65) Prior Publication Data

US 2002/0097771 A1 Jul. 25, 2002

Related U.S. Application Data

(60) Provisional application No. 60/251,629, filed on Dec. 6, 2000, and provisional application No. 60/251,631, filed on Dec. 6, 2000.

(51) Int. Cl.$^7$ ............................................... H01S 3/00
(52) U.S. Cl. ................................... 372/50; 372/99
(58) Field of Search ............................... 372/50, 23, 96

(56) References Cited

U.S. PATENT DOCUMENTS

| | | | |
|---|---|---|---|
| 5,031,187 A | | 7/1991 | Orenstein et al. .............. 372/50 |
| 5,206,871 A | * | 4/1993 | Deppe et al. .................. 372/45 |
| 5,493,577 A | | 2/1996 | Choquette et al. ............. 372/46 |
| 5,624,791 A | | 4/1997 | Kawabata et al. ........... 430/325 |
| 5,677,924 A | * | 10/1997 | Bestwick ....................... 372/46 |
| 5,699,375 A | | 12/1997 | Paoli ............................. 372/50 |
| 5,898,722 A | | 4/1999 | Ramdani et al. .............. 372/50 |
| 5,902,702 A | | 5/1999 | Nakao et al. ................... 430/5 |
| 5,963,568 A | * | 10/1999 | Paoli ............................. 372/23 |
| 6,117,699 A | | 9/2000 | Lemoff et al. ................. 438/35 |
| 6,148,016 A | | 11/2000 | Hegblom et al. .............. 372/50 |
| 6,160,834 A | * | 12/2000 | Scott ............................. 372/96 |
| 6,195,485 B1 | * | 2/2001 | Coldren et al. ................ 385/49 |
| 6,234,192 B1 | * | 5/2001 | Esche et al. ............. 137/355.25 |

FOREIGN PATENT DOCUMENTS

| | | | | |
|---|---|---|---|---|
| JP | 09036495 | * | 2/1997 | ........... H01S/3/103 |

OTHER PUBLICATIONS

Karim et al., "1.55–$\mu$m Vertical–Cavity Laser Arrays for Wavelength–Division Multiplexing," *IEEE Journal on Selected Topics in Quantum Electronics*, vol. 7, No. 2, (2001), pp. 178–183.

* cited by examiner

*Primary Examiner*—Paul Ip
*Assistant Examiner*—Dung T Nguyen
(74) *Attorney, Agent, or Firm*—N. Stephan Kinsella; Randall C. Furlong

(57) ABSTRACT

An optical device has at least one reflector disposed in an optical cavity. The reflector has a plurality of mirror pairs each comprising a pair of layers, each layer of each mirror pair having an index of refraction different than that of the other layer of the respective mirror pair. A tuning layer is disposed in the reflector, the tuning layer having an index of refraction different from that of the layers of the mirror pairs. In another embodiment, the reflector has first and second adjacent reflector sections, each reflector section having a respective plurality of mirror pairs where the difference in refractive index of a mirror pair's layers defines a refractive index contrast for the mirror pair. The mirror pairs of the first reflector section have a refractive index contrast different than that of the second reflector section, and a tuning layer is disposed in the optical cavity adjacent to the second reflector section and having an index of refraction different from that of the layers of the mirror pairs of the second reflector section.

19 Claims, 18 Drawing Sheets

MODIFIED DISTRIBUTED BRAGG REFLECTOR (DBR) FOR VERTICAL CAVITY SURFACE-EMITTING LASER (VCSEL) RESONANT WAVELENGTH TUNING SENSITIVITY CONTROL

CROSS-REFERENCES TO RELATED APPLICATIONS

This nonprovisional U.S. national application, filed under 35 U.S.C. § 111(a), claims, under 37 C.F.R. § 1.78(a)(3), the benefit of the filing date of provisional U.S. national application No. 60/251,629, filed on Dec. 6, 2000 under 35 U.S.C. § 111(b), and the benefit of the filing date of provisional U.S. national application No. 60/251,631, filed on Dec. 6, 2000 under 35 U.S.C. § 111 (b), the entireties of each of which are incorporated herein by reference without disclaimer.

BACKGROUND OF THE INVENTION

1. Field of the Invention

This invention relates generally to laser manufacturing and, more particularly, to vertical cavity surface-emitting lasers (VCSELs).

2. Description of the Related Art

In many applications, it is desirable to have lasers capable of producing light at several different wavelengths that are closely spaced. In particular, for optical communication applications, such as wavelength division multiplexing (WDM), many wavelengths spaced a few nanometers apart are useful. There are several possible ways to make wavelength-selectable arrays with edge-emitting semiconductor lasers. However, edge-emitting semiconductor lasers that meet specifications for telecommunication applications are typically complex and expensive to manufacture. Monolithic edge-emitting semiconductor laser arrays with large numbers of wavelengths are impractical technically and economically.

Vertical cavity surface-emitting lasers (VCSELs) provide a more cost effective solution for many applications. Vertical cavity surface-emitting lasers (VCSELs) can be made using wafer-scale processing and testing, dramatically lowering the cost in comparison to edge-emitting semiconductor lasers, for example. In a vertical cavity surface-emitting laser (VCSEL), the wavelength may be determined by the optical cavity length. The optical cavity length is the effective distance between the two generally parallel mirrors, typically distributed Bragg reflectors (DBRs), enclosing the active region of the vertical cavity surface-emitting laser (VCSEL). Since the optical cavity length is typically set by the epitaxial growth, which should be uniform across the entire wafer or workpiece, the wavelength is uniform.

Tunable vertical cavity surface-emitting lasers (VCSELs) are desired in order to provide different wavelengths on the same wafer or workpiece. One conventional approach to providing tunable vertical cavity surface-emitting lasers (VCSELs) uses a top mirror that is suspended on a micromachined cantilever. With this conventional structure, any given vertical cavity surface-emitting laser (VCSEL) can be tuned to any wavelength within the tuning range. However, this conventional approach involves a micromachined structure that is difficult to fabricate, has reliability problems and is susceptible to mechanical vibrations. A more reliable way of providing monolithically integrated vertical cavity surface-emitting laser (VCSEL) arrays is still needed.

In a vertical cavity surface-emitting laser (VCSEL), the lasing wavelength may be determined by the length of a Fabry-Perot cavity formed by two distributed Bragg reflectors (DBRs) separated by the semiconductor optical cavity active region that includes layers with optical gain. The optical gain in a vertical cavity surface-emitting laser (VCSEL) is typically provided by quantum wells. Each quantum well has a gain spectrum with a single peak wavelength, and some spectral width over which gain is present. Each distributed Bragg reflector (DBR) is composed of quarter-wave layers of alternating high and low refractive indices. The distributed Bragg reflector (DBR) reflectivity is characterized by a complex amplitude and phase spectrum. The amplitude spectrum exhibits a high reflectivity region at the center of which the reflectivity is highest. The width of the high reflectivity region is referred to as the distributed Bragg reflector (DBR) stop-band width. The phase characteristic of the distributed Bragg reflector (DBR) varies approximately linearly over the stop-band width. The lasing wavelength of a vertical cavity surface-emitting laser (VCSEL) is determined by the optical length of the semiconductor cavity and the phase characteristics of the distributed Bragg reflectors (DBRs). The gain provided by the active layer, necessary to achieve lasing (threshold gain) is determined by the roundtrip cavity loss that includes material absorption and the distributed Bragg reflector (DBR) transmission. A monolithic multiple-wavelength vertical cavity surface-emitting laser (VCSEL) array requires side-by-side fabrication of vertical cavity surface-emitting lasers (VCSELs) with varying lasing wavelengths, but otherwise uniform laser characteristics, such as threshold gain and current, and efficiency. This implies that the vertical structure of the lasers must vary from device to device on the same wafer, while the cavity losses, material gain, and the distributed Bragg reflector (DBR) transmission remain largely unchanged. The lasing wavelength variation is most commonly realized by changing the optical length of the semiconductor cavity.

One conventional method of making a monolithic multiple wavelength vertical cavity surface-emitting laser (VCSEL) array uses non-uniform growth due to a thermal gradient. The backside of a substrate is patterned prior to epitaxial growth in a molecular beam epitaxy (MBE) reactor. The resulting backside pattern produces a thermal gradient on the surface of the substrate when the wafer is heated. Because growth rate is temperature dependent, there is a variable material thickness and, hence, a variable laser wavelength along the thermal gradient. One disadvantage of this conventional approach is the fact that the arrays are limited to linear geometries. To date, it has been difficult to control the wavelengths precisely and repeatedly over large areas of the wafer.

Another conventional method is to grow a partial vertical cavity surface-emitting laser (VCSEL) structure including the lower distributed Bragg reflector (DBR), the active region, and some part of the upper distributed Bragg reflector (DBR). The wafer is masked and anodically oxidized to some controlled oxide thickness over the exposed portions. A selective etch is then used to remove the oxide. This process is repeated to create different effective cavity lengths for each laser in an array. The remainder of the vertical cavity surface-emitting laser (VCSEL) structure is regrown over the patterned wafer. However, each selective etch is sensitive to voltage and concentration variations that may affect the depth, resulting in reduced control over wavelength spacing between devices in the array.

Yet another conventional method of making a monolithic multiple wavelength vertical cavity surface-emitting laser (VCSEL) array is described, for example, in U.S. Pat. No.

6,117,699 to Lemoff et al. ("the Lemoff et al. '699 patent"), describing an array of N-wavelength vertical cavity surface-emitting lasers (VCSELs) that can be grown with wavelength control. First, as shown in FIG. 1, a foundation vertical cavity surface-emitting laser (VCSEL) structure 100 is grown on a gallium arsenide (GaAs) substrate 105. The foundation vertical cavity surface-emitting laser (VCSEL) structure 100 includes a lower distributed Bragg reflector (DBR) 110 in an optical cavity 145. The lower distributed Bragg reflector (DBR) 110 includes M pairs of layers 115, 120, 125, 130, 135 and 140 (M=6, in FIG. 1), each member of each pair having an index of refraction differing from the other member of each pair. For example, the lower member 115a of the pair 115 may comprise aluminum arsenide (AlAs) and the upper member 115b of the pair 115 may comprise aluminum gallium arsenide ($Al_xGa_{1-x}As$, where $0.15<x<1$).

The optical cavity 145 also includes a first intrinsic (non-doped) layer 150, an optical gain layer 155 and a second intrinsic (non-doped) layer 160. The optical cavity 145 also includes N-paired semiconductor phase shift epitaxially grown layers 165, 170, 175 and 180 (N=4 in FIG. 1) of aluminum gallium arsenide (AlGaAs) and indium gallium phosphide (InGaP), where N is the desired number of different wavelengths.

Next, a region of one of the N-paired semiconductor phase shift layers is lithographically patterned (masked and etched). For example, as shown in FIG. 1, a mask 185 is formed and portions 190 and 195 (shown in phantom) of the paired semiconductor phase shift epitaxially grown layer 180 are removed by selective etching. The steps of patterning (masking and etching) are repeated for a total of at least (N−1)/2 patterning (masking and etching) steps until regions of at least N−1 of the N-paired semiconductor phase shift layers are etched. For example, as shown in FIG. 2, a mask 200 is formed and portions 205 and 210 (shown in phantom) of the paired semiconductor phase shift epitaxially grown layers 170, 175 and 180 are removed by selective etching, forming 4 different effective optical cavity lengths corresponding to 4 different lasing wavelengths.

Finally, an upper vertical cavity surface-emitting laser (VCSEL) structure (not shown) is grown. The upper vertical cavity surface-emitting laser (VCSEL) structure may include an upper distributed Bragg reflector (DBR) similar to the lower distributed Bragg reflector (DBR) 110, but typically having fewer than M pairs of layers, each member of each pair having an index of refraction differing from the other member of each pair. The upper distributed Bragg reflector (DBR) typically has fewer than M pairs of layers so that the reflectivity of the upper distributed Bragg reflector (DBR) is less than the reflectivity of the lower distributed Bragg reflector (DBR) 110. Equivalently, the transmissivity of the upper distributed Bragg reflector (DBR) is greater than the transmissivity of the lower distributed Bragg reflector (DBR) 110. Consequently, more laser photons are emitted from the upper surface (not shown) of the vertical cavity surface-emitting laser (VCSEL) than into the substrate 105.

However, this Lemoff et al. '699 patent method necessarily requires at least (N-1)/2 masking steps, to produce an array of N-wavelength vertical cavity surface-emitting lasers (VCSELs). For a large number N of wavelengths, such methods may become expensive, unwieldy, impractical and inefficient and may suffer from a loss of yield.

For example, as shown in FIG. 3, a foundation vertical cavity surface-emitting laser (VCSEL) structure 300 is grown on the gallium arsenide (GaAs) substrate 105. The foundation vertical cavity surface-emitting laser (VCSEL) structure 300 includes the lower distributed Bragg reflector (DBR) 110 and an optical cavity 345. The optical cavity 345 includes the first intrinsic (non-doped) layer 150, the optical gain layer 155 and the second intrinsic (non-doped) layer 160. The optical cavity 345 also includes N-paired semiconductor phase shift epitaxially grown layers 165, 170, 175, 180, 365, 370, 375 and 380 (N=8 in FIG. 3) of aluminum gallium arsenide (AlGaAs) and indium gallium phosphide (InGaP), where N is the desired number of different wavelengths.

Next, a region of one of the N-paired semiconductor phase shift layers is lithographically patterned (masked and etched). For example, as shown in FIG. 3, a mask 305 is formed and portions 390 and 395 (shown in phantom) of the paired semiconductor phase shift epitaxially grown layer 380 are removed by selective etching. The steps of patterning (masking and etching) are repeated for a total of at least (N−1)/2 patterning (masking and etching) steps until regions of at least N−1 of the N-paired semiconductor phase shift layers are etched. For example, as shown in FIG. 4, a mask 400 is formed and portions 405 and 410 (shown in phantom) of the paired semiconductor phase shift epitaxially grown layers 370, 375 and 380 are removed by selective etching. Then, as shown in FIG. 5, a mask 500 is formed and a portion 505 (shown in phantom) of the paired semiconductor phase shift epitaxially grown layer 365 is removed by selective etching. Finally, two more patterning steps (similar to those shown in FIGS. 1 and 2) may be performed to remove respective portions (similar to the portions 190, 195, 205 and 210 shown in FIGS. 1 and 2) from the paired semiconductor phase shift epitaxially grown layers 170, 175 and 180 by selective etching, forming 8 different effective optical cavity lengths corresponding to 8 different lasing wavelengths, but using as many as 5 patterning steps.

Resonant optical cavities are used in many devices including vertical cavity surface-emitting lasers (VCSELs), optical filters (such as band-pass filters), resonant cavity-based optical devices, resonant cavity-based opto-electronic devices and resonant cavity-enhanced photodetectors. The general structure of such a device consists of a cavity region including a reflector on each end of the device. These reflectors are often distributed Bragg reflectors (DBRs) that are made from multiple pairs of material with alternating refractive indices. The higher the contrast in material index of refraction, the lower the number of mirror pairs that are required to achieve the desired reflectivity. For many structures these layers are made from semiconductors whose refractive indices tend to be similar. It is also possible, and in some cases desirable, to fabricate the top reflector using dielectric materials with a greater contrast than is available using distributed Bragg reflectors (DBRs) made entirely of semiconducting materials.

There are also applications, in optical communication for instance, where it is desirable to have arrays of lasers, filters, or detectors with closely-spaced wavelengths. The wavelength may be changed by altering the effective cavity length of the device. The effective cavity length at a given wavelength is determined by the layer thicknesses and material properties in the optical cavity and the phase shift due to the reflectors. There are previous approaches (U.S. Pat. No. 6,117,699) in which the optical cavity length is adjusted by varying the thickness of material within the optical cavity. This can be achieved by depositing and selectively removing layer thicknesses within the optical cavity. This approach relies on the epitaxial growth of a specific pair of semiconductor materials to achieve the precision and etch selectivity required. However, this approach limits the technique to a specific range of wavelengths.

The sensitivity of the resonant (for example, the lasing) wavelength depends in part on the distributed Bragg reflector (DBR) materials utilized. However, the choice of distributed Bragg reflector (DBR) materials is often dictated by other concerns (compatibility with device operation, compatibility with the processing, reliability, and the like). Since the required sensitivity depends on the desired wavelength spacing for the particular application, it would be desirable to be able to adjust the sensitivity of the optical cavity to the thickness of the tuning layers. In particular, for improved process control, it would often be desirable to decrease the sensitivity of the wavelength to variations in the tuning layer thickness.

The present invention is directed to overcoming, or at least reducing the effects of, one or more of the problems set forth above.

SUMMARY OF THE INVENTION

In one aspect of the present invention, a method is provided, the method comprising forming an optical cavity for an optical device and forming at least one reflector for the optical cavity for the optical device, the at least one reflector having at least two sections. The method also comprises providing at least one of a tuning layer between the at least two sections of the at least one reflector and different refractive index contrasts for the at least two sections of the at least one reflector.

In another aspect of the present invention, a device is provided, the device comprising an optical cavity for an optical device, the optical cavity having at least one reflector having at least two sections. The device also comprises at least one of a tuning layer between the at least two sections of the at least one reflector and different refractive index contrasts for the at least two sections of the at least one reflector.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
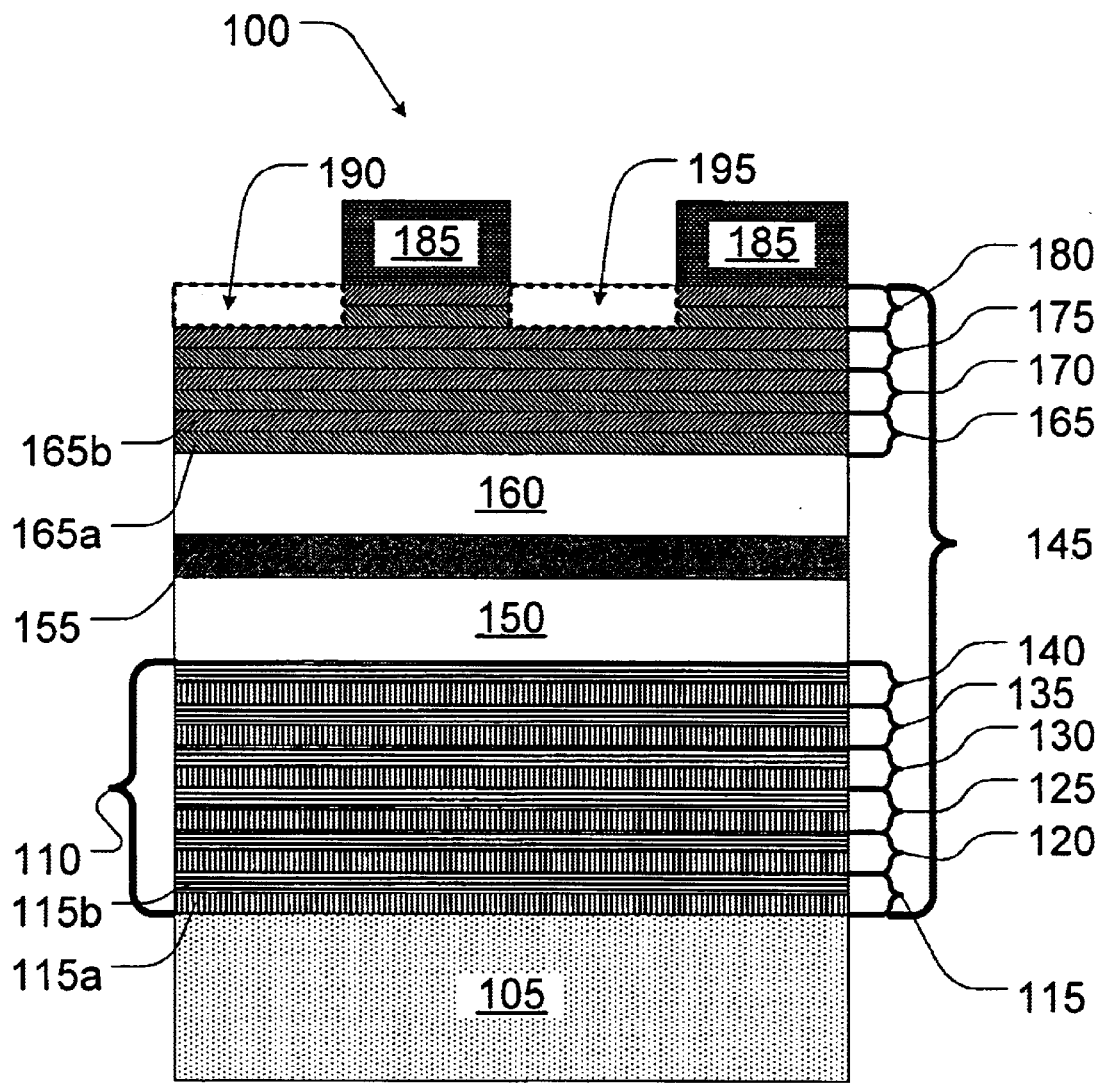
FIGS. 1–5 schematically illustrate conventional methods and devices for manufacturing monolithic multiple wavelength vertical cavity surface-emitting laser (VCSEL) arrays.
Figure 2:
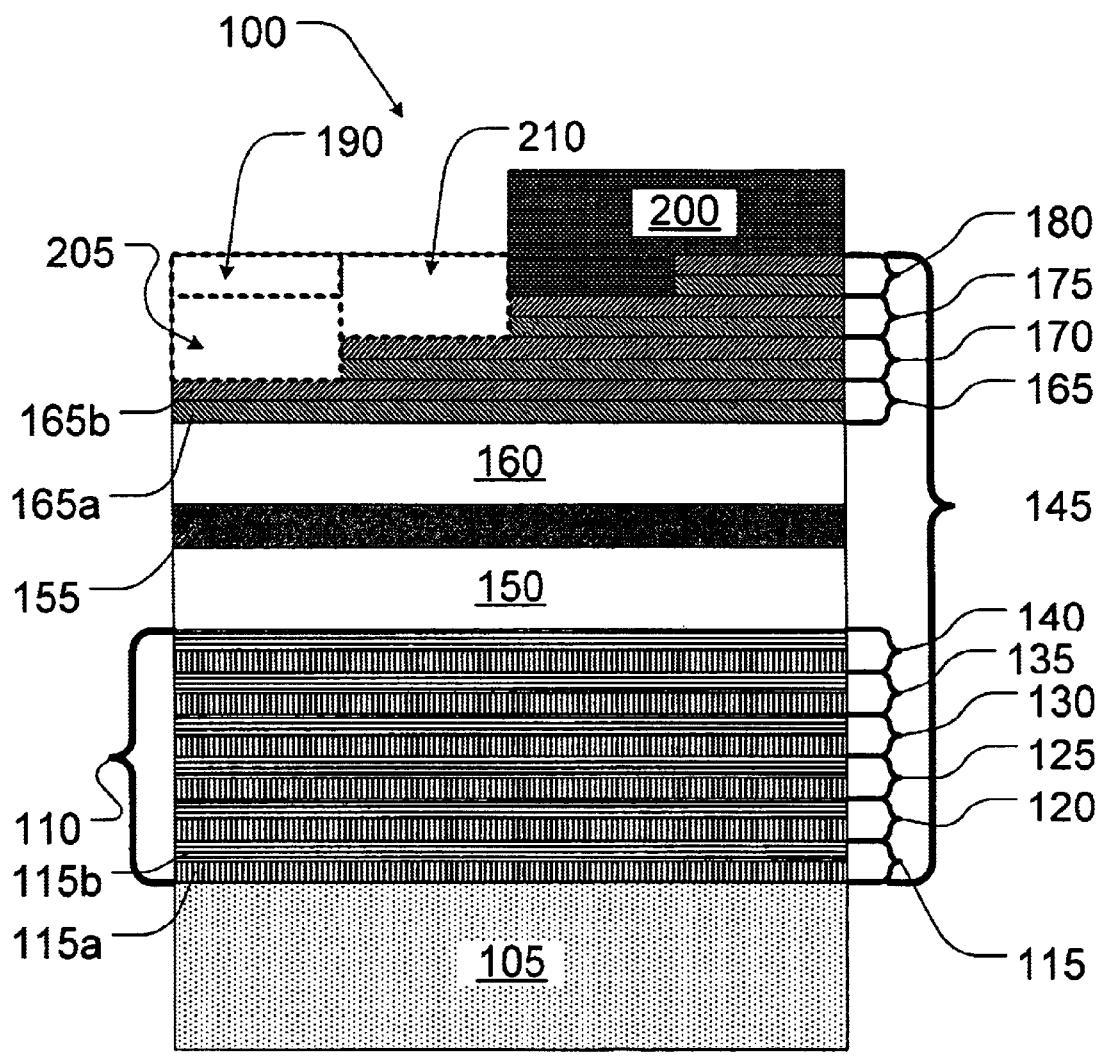
Figure 3:
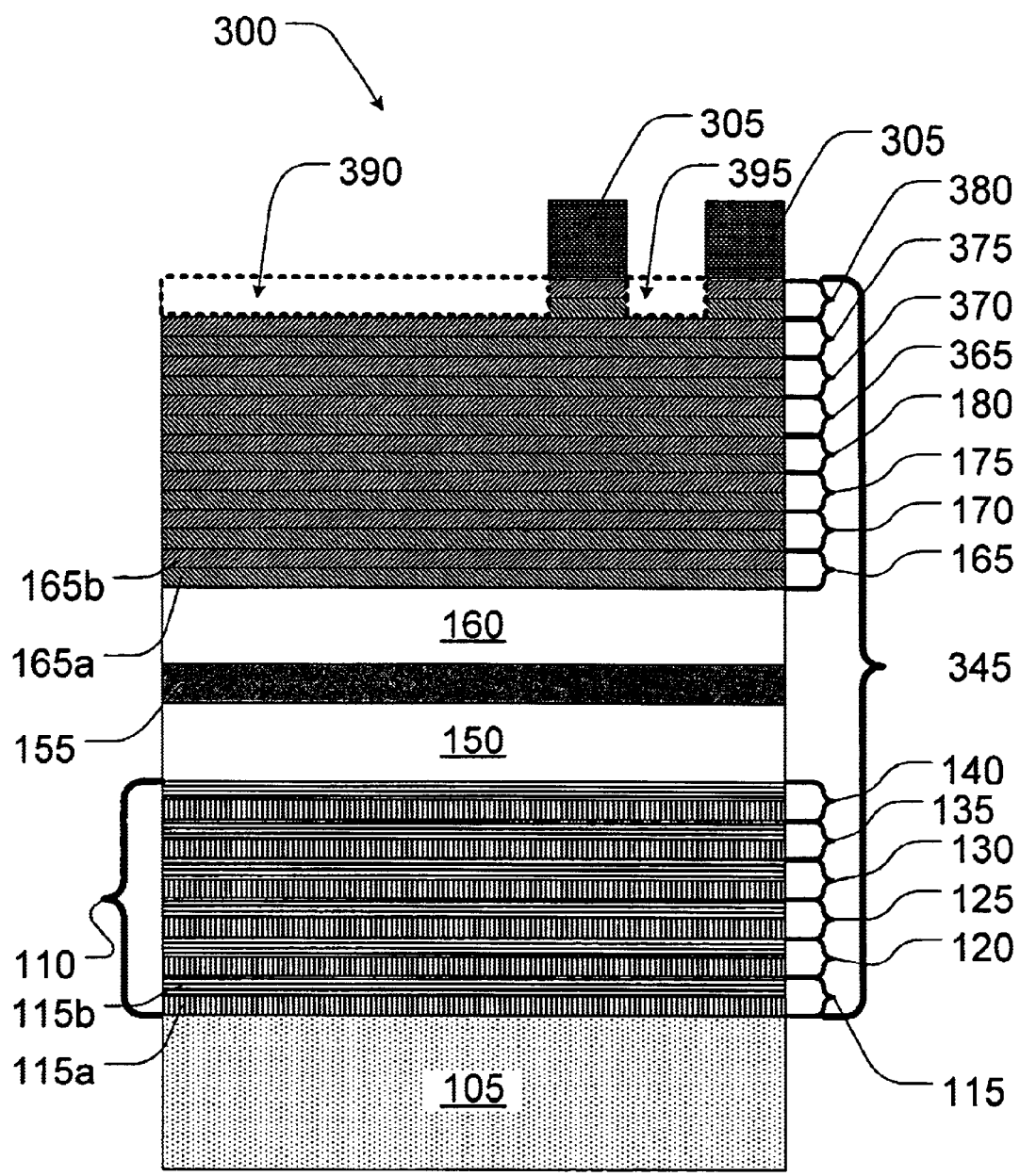
Figure 4:
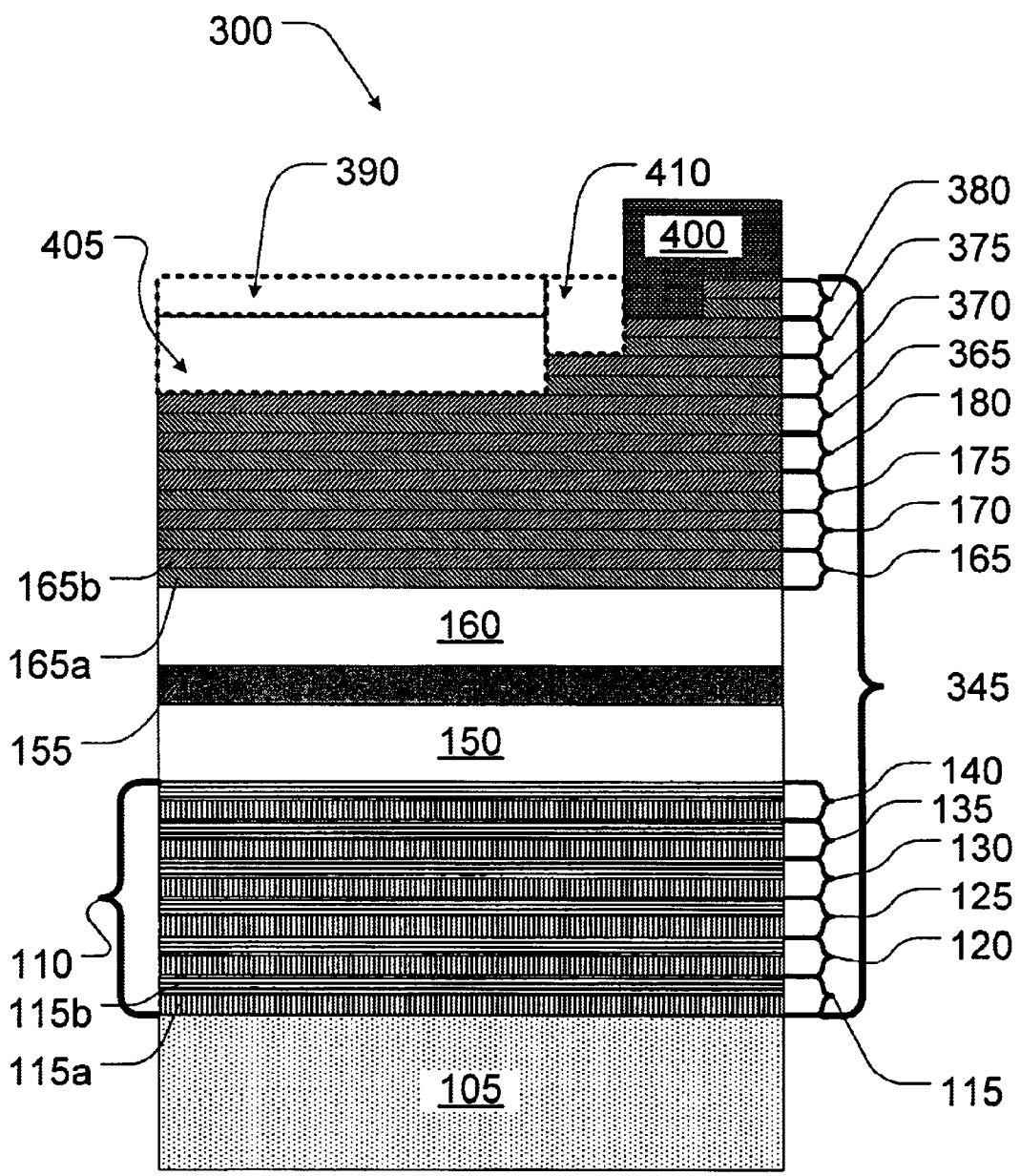
Figure 5:
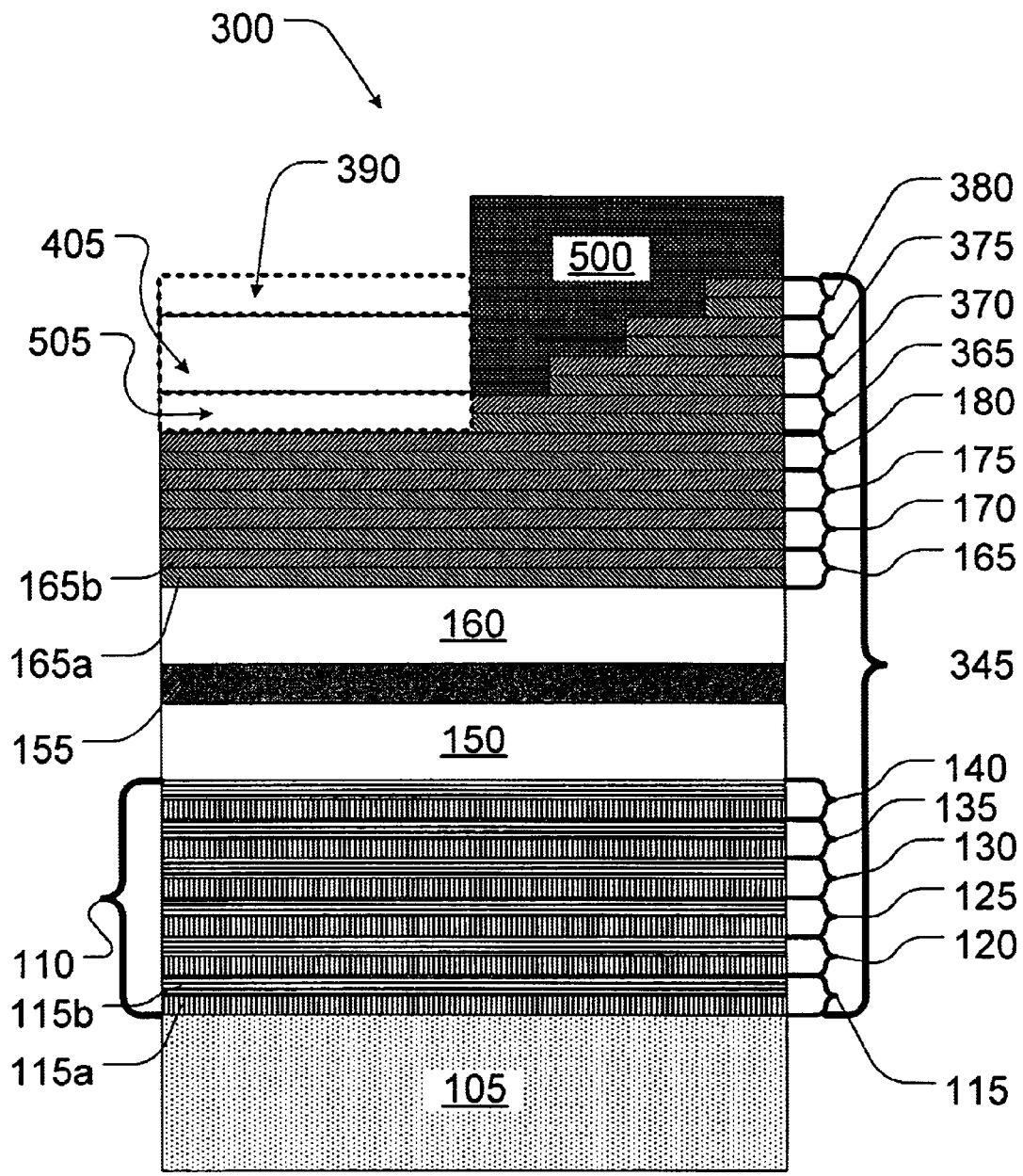

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 6:
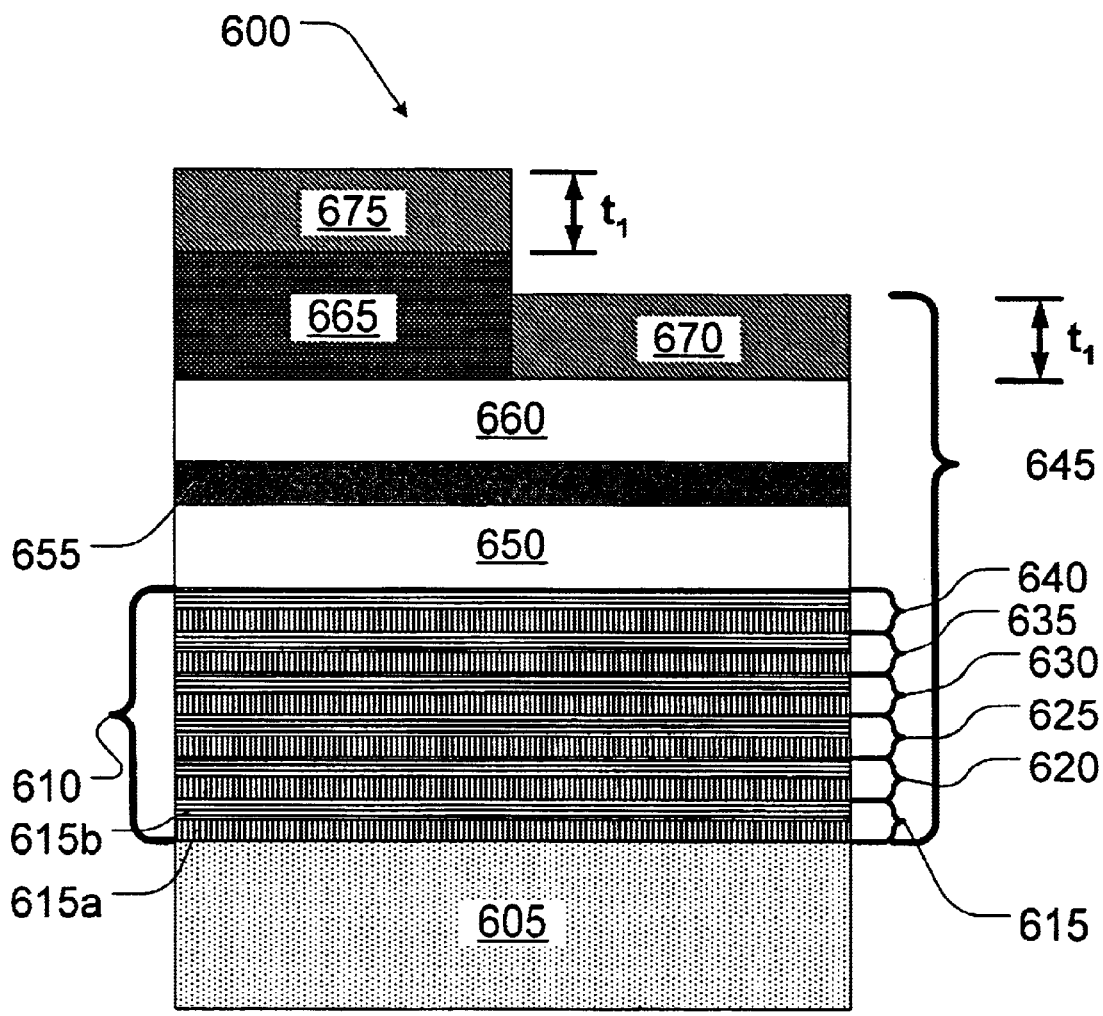
FIGS. 6–18 schematically illustrate various embodiments of a method and a device according to the present invention.

Illustrative embodiments of a method and a device according to the present invention are shown in FIGS. 6–18. As shown in FIG. 6, a vertical cavity surface-emitting laser (VCSEL) structure 600 may be grown on a substrate 605, such as a gallium arsenide (GaAs) substrate or an indium phosphide (InP) substrate. The vertical cavity surface-emitting laser (VCSEL) structure 600 may comprise a lower distributed Bragg reflector (DBR) 610 and an optical cavity 645. In various illustrative embodiments, the lower distributed Bragg reflector (DBR) 610 may be n-doped. The lower distributed Bragg reflector (DBR) 610 may comprise M pairs of layers 615, 620, 625, 630, 635 and 640 (M=6, in FIG. 6), each member of each pair having an index of refraction differing from the other member of each pair. In various illustrative embodiments, the number of pairs M may be in a range of about 4 to about 60. The lower distributed Bragg reflector (DBR) 610 may by formed, for example, on the substrate 605 by molecular beam epitaxy (MBE). For example, when the substrate 605 is gallium arsenide (GaAs), the lower member 615a of the pair 615 may comprise aluminum arsenide (AlAs) and the upper member 615b of the pair 615 may comprise aluminum gallium arsenide ($Al_xGa_{1-x}As$, where $0.15<x<1$). In various illustrative embodiments, $x=0.3$. In various alternative illustrative embodiments, for example, the lower distributed Bragg reflector (DBR) 610 may comprise a wide variety of suitable materials that may be chosen for various reasons including cost, reliability, manufacturability, and the like.

The optical cavity 645 includes a first intrinsic (non-doped) layer 650, formed of aluminum gallium arsenide (AlGaAs), indium gallium phosphide (InGaP), gallium arsenide (GaAs) or indium phosphide (InP), an optical gain layer 655 and a second intrinsic (non-doped) layer 660, formed of aluminum gallium arsenide (AlGaAs), indium gallium phosphide (InGaP), gallium arsenide (GaAs) or indium phosphide (InP). While the layers 650 and 660 may be intrinsic, non-doped, and/or undoped (also known as unintentionally doped), there is a trade-off between electrical conductivity and free-carrier absorption. This trade-off requires a lower relative doping in these layers 650 and 660, but for electrical pumping, these layers 650 and 660 may have to have some non-zero amount of doping.

In various illustrative embodiments, having a first intrinsic (non-doped) layer 650 lattice matched to a gallium arsenide (GaAs) substrate 605, the optical gain layer 655 may comprise about a 2200 Å layer of aluminum gallium arsenide ($Al_xGa_{1-x}As$, where $x=0.3$) interspersed with about 3 aluminum gallium arsenide ($Al_xGa_{1-x}As$, where $x=0.12$) quantum wells (QWs) or about 3 gallium arsenide (GaAs) quantum wells (QWs), suitable for wavelengths in a range of about 0.6 microns to about 1.0 microns. In various alternative illustrative embodiments, having a first intrinsic (non-doped) layer 650 lattice matched to an indium phosphide (InP) substrate 605, the optical gain layer 655 may comprise about a 2200 Å layer of indium gallium arsenide phosphide ($In_xGa_{1-x}As_yP_{1-y}$, where x is about 0.8 and y is about 0.4, for example) interspersed with about 3 indium phosphide (InP) quantum wells (QWs) or about 3 indium gallium arsenide ($In_yGa_{1-y}As$, where y=0.2) quantum wells (QWs), suitable for wavelengths in a range of up to about 1.6 microns.

The optical cavity 645 may also comprise a phase shift layer 670. The phase shift layer 670 may have a thickness $t_1$ in a range of about 10–1000 Å. The phase shift layer 670 may be formed using a lithographically patterned masking or lift-off layer 665 comprising photoresist, for example, capable of being selectively removed with respect to the phase shift layer 670. The lithographically patterned masking or lift-off layer 665 may cover a fraction of the area of the upper surface of the vertical cavity surface-emitting laser (VCSEL) structure 600. In various illustrative embodiments, for example, the lithographically patterned masking or lift-off layer 665 may cover about half the area of the upper surface of the vertical cavity surface-emitting laser (VCSEL) structure 600. In various illustrative embodiments, for example, the phase shift layer 670 comprises silicon dioxide ($SiO_2$). In various alternative illustrative embodiments, for example, the phase shift layer 670 may comprise a wide variety of suitable materials that may be chosen for various reasons including cost, reliability, manufacturability, and the like. When the phase shift layer 670 is formed, a phase shift layer 675 is also formed on the lithographically patterned masking or lift-off layer 665 comprising photoresist. When the lithographically patterned masking or lift-off layer 665 comprising photoresist is removed by being lifted off, for example, the phase shift layer 675 is also removed, leaving the phase shift layer 670 formed as a portion of the optical cavity 645 for at least a portion of the vertical cavity surface-emitting laser (VCSEL) structure 600.

Figure 7:
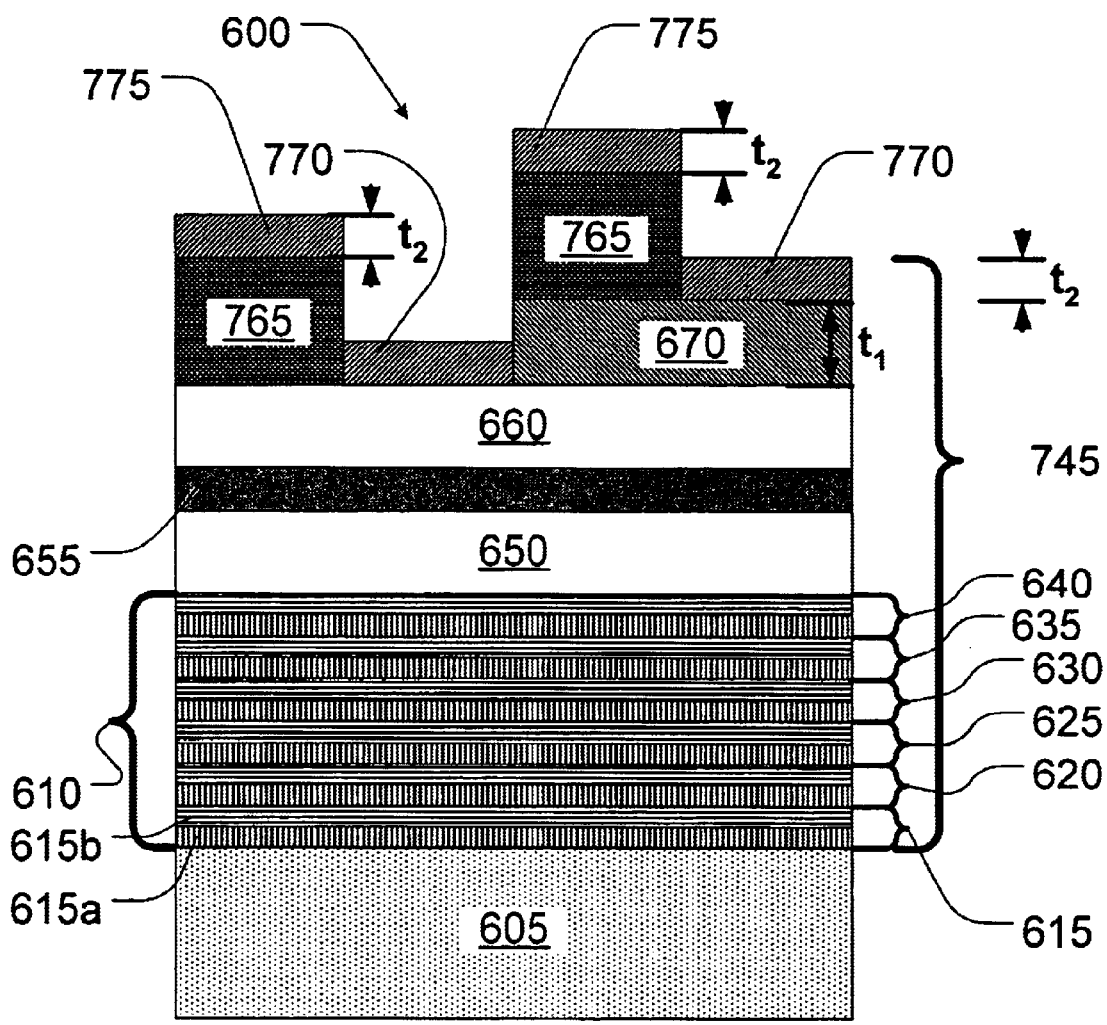

As shown in FIG. 7, an optical cavity 745 may also comprise a phase shift layer 770. The phase shift layer 770 may have a thickness $t_2$ in a range of about 10–1000 Å. The phase shift layer 770 may be formed using a lithographically patterned masking or lift-off layer 765 comprising photoresist, for example, capable of being selectively removed with respect to the phase shift layer 770. The lithographically patterned masking or lift-off layer 765 may cover about half the area of the upper surface of the vertical cavity surface-emitting laser (VCSEL) structure 600. The lithographically patterned masking or lift-off layer 765 may comprise a plurality of portions each covering about half the area of each portion of the lithographically patterned masking or lift-off layer 665.

In various illustrative embodiments, for example, the phase shift layer 770 comprises silicon dioxide ($SiO_2$). The phase shift layer 770 may comprise a plurality of portions each covering about half the area of each portion of the phase shift layer 670. When the phase shift layer 770 is formed, a phase shift layer 775 is also formed on the lithographically patterned masking or lift-off layer 765 comprising photoresist. When the lithographically patterned masking or lift-off layer 765 comprising photoresist is removed by being lifted off, for example, the phase shift layer 775 is also removed, leaving the phase shift layer 770 formed as a portion of the optical cavity 745 for at least a portion of the vertical cavity surface-emitting laser (VCSEL) structure 600.

The optical cavity 745 of the vertical cavity surface-emitting laser (VCSEL) structure 600 has 4 different effective optical cavity lengths formed, corresponding to 4 different lasing wavelengths. One effective optical cavity length includes no additional phase shift layer thickness, another effective optical cavity length includes the phase shift layer 770 having a thickness $t_2$, another effective optical cavity length includes the phase shift layer 670 having a thickness $t_1$, and another effective optical cavity length includes the phase shift layers 670 and 770 having a combined thickness $t_1+t_2$, corresponding respectively to the 4 different lasing wavelengths for 4 vertical cavity surface-emitting lasers (VCSELs) 840, 850, 860 and 870 (FIG. 8) in a monolithic array. Note that while the 4 vertical cavity surface-emitting lasers (VCSELs) 840, 850, 860 and 870 in the monolithic array illustrated in FIGS. 7 and 8 are linearly arranged, other non-linear geometries are possible, of course, as one of ordinary skill in the art having the benefit of the present disclosure would know.

Figure 8:
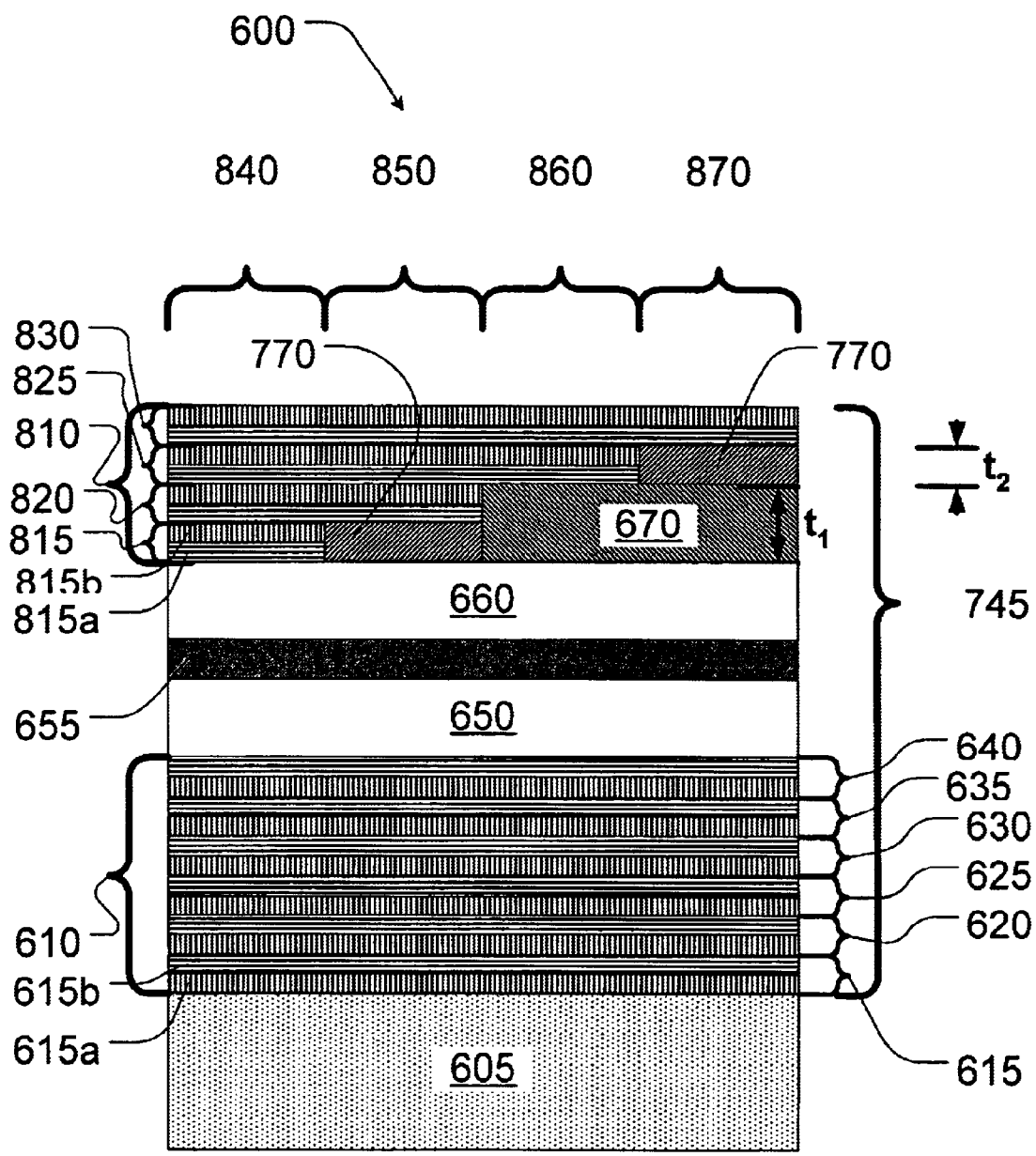

Finally, as shown in FIG. 8, an upper vertical cavity surface-emitting laser (VCSEL) structure 810 is deposited. The upper vertical cavity surface-emitting laser (VCSEL) structure 810 may include an upper distributed Bragg reflector (DBR) similar to the lower distributed Bragg reflector (DBR) 610 (FIG. 6), but typically having L pairs of layers 815, 820, 825 and 830 (L=4, in FIG. 8), each member of each pair having an index of refraction differing from the other member of each pair. In various illustrative embodiments, the number of pairs L may be in a range of about 4 to about 60. The upper distributed Bragg reflector (DBR) 810 may by formed, for example, on the optical cavity 745 by sputtering. For example, the lower member 815*a* of the pair 815 may comprise titanium oxide ($TiO_2$) and the upper member 815*b* of the pair 815 may comprise silicon oxide ($SiO_2$). Alternatively, for example, the lower member 815*a* of the pair 815 may comprise aluminum gallium arsenide ($Al_xGa_{1-x}As$, where 0.15<x<1) and the upper member 815*b* of the pair 815 may comprise aluminum arsenide (AlAs). In various alternative illustrative embodiments, for example, the upper distributed Bragg reflector (DBR) 810 may comprise a wide variety of suitable materials that may be chosen for various reasons including cost, reliability, manufacturability, and the like.

Figure 9:
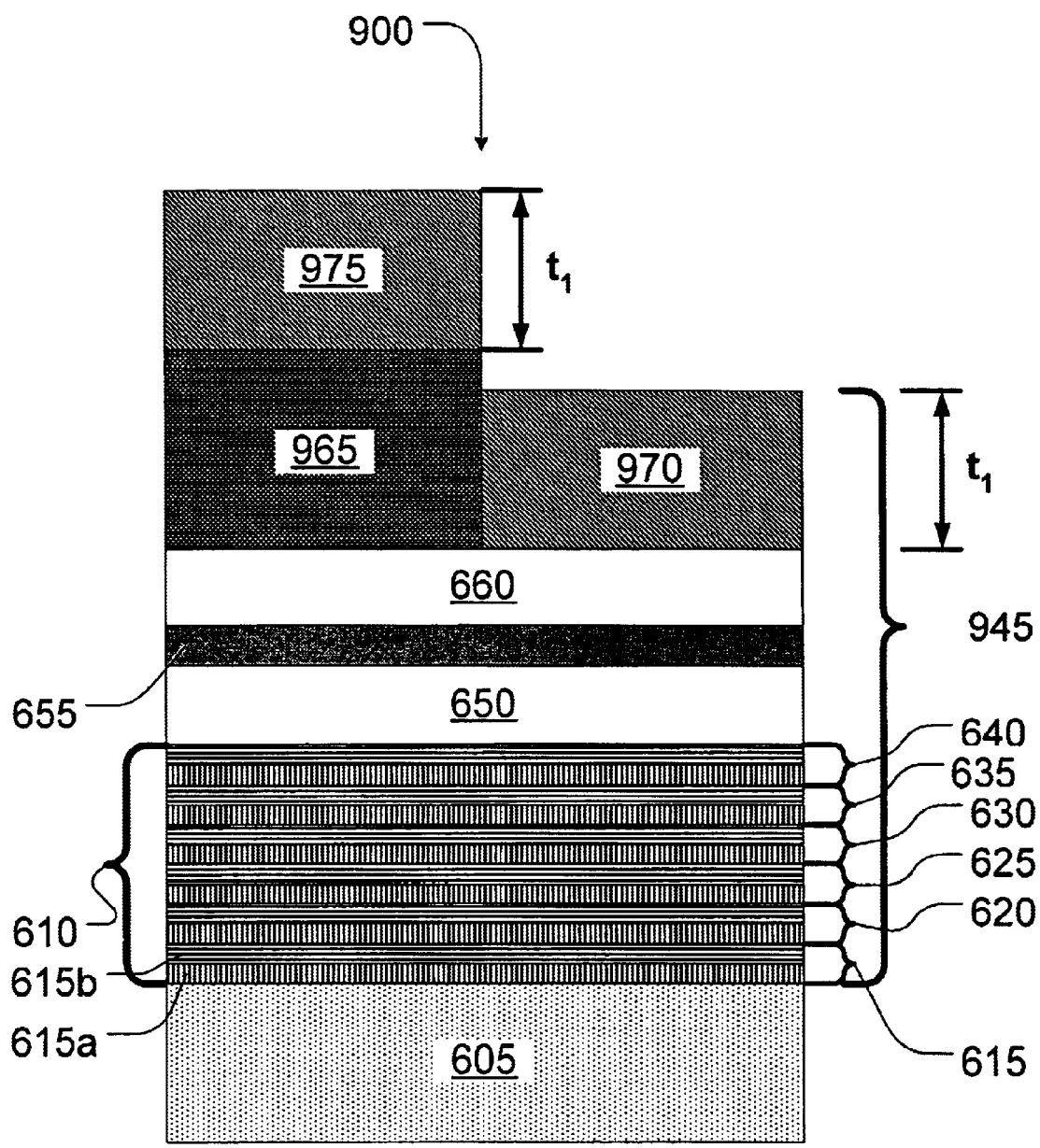

As shown in FIG. 9, a vertical cavity surface-emitting laser (VCSEL) structure 900 may be grown on a substrate 605, such as a gallium arsenide (GaAs) substrate or an indium phosphide (InP) substrate. The vertical cavity surface-emitting laser (VCSEL) structure 900 may comprise a lower distributed Bragg reflector (DBR) 610 and an optical cavity 945. In various illustrative embodiments, the lower distributed Bragg reflector (DBR) 610 may be as described above in conjunction with FIG. 6. The optical cavity 945 includes a first intrinsic (non-doped) layer 650, formed of aluminum gallium arsenide (AlGaAs), indium gallium phosphide (InGaP), gallium arsenide (GaAs) or indium phosphide (InP), an optical gain layer 655 and a second intrinsic (non-doped) layer 660, formed of aluminum gallium arsenide (AlGaAs), indium gallium phosphide (InGaP), gallium arsenide (GaAs) or indium phosphide (InP). In various illustrative embodiments, having a first intrinsic (non-doped) layer 650 lattice matched to a gallium arsenide (GaAs) substrate 605, the optical gain layer 655 may comprise about a 2200 Å layer of aluminum gallium arsenide ($Al_xGa_{1-x}As$, where x=0.3) interspersed with about 3 aluminum gallium arsenide ($Al_xGa_{1-x}As$, where x=0.12) quantum wells (QWs) or about 3 gallium arsenide (GaAs) quantum wells (QWs), suitable for wavelengths in a range of about 0.6 microns to about 1.0 microns. In various alternative illustrative embodiments, having a first intrinsic (non-doped) layer 650 lattice matched to an indium phosphide (InP) substrate 605, the optical gain layer 655 may comprise about a 2200 Å layer of indium gallium arsenide phosphide ($In_xGa_{1-x}As_yP_{1-y}$, where x is about 0.8 and y is about 0.4, for example) interspersed with about 3 indium phosphide (InP) quantum wells (QWs) or about 3 indium gallium arsenide ($In_yGa_{1-y}As$, where y=0.2) quantum wells (QWs), suitable for wavelengths in a range of up to about 1.6 microns.

The optical cavity 945 may also comprise a phase shift layer 970. The phase shift layer 970 may have a thickness $t_1$ in a range of about 10–1000 Å. The phase shift layer 970 may be formed using a lithographically patterned masking or lift-off layer 965 comprising photoresist, for example, capable of being selectively removed with respect to the phase shift layer 970. The lithographically patterned masking or lift-off layer 965 may cover a fraction, such as about an eighth or about a quarter or about half, of the area of the upper surface of the vertical cavity surface-emitting laser (VCSEL) structure 900. In various illustrative embodiments, for example, the phase shift layer 970 comprises silicon dioxide ($SiO_2$). When the phase shift layer 970 is formed, a phase shift layer 975 is also formed on the lithographically patterned masking or lift-off layer 965 comprising photoresist. When the lithographically patterned masking or lift-off layer 965 comprising photoresist is removed by being lifted off, for example, the phase shift layer 975 is also removed, leaving the phase shift layer 970 formed as a portion of the optical cavity 945 for at least a portion of the vertical cavity surface-emitting laser (VCSEL) structure 900.

Figure 10:
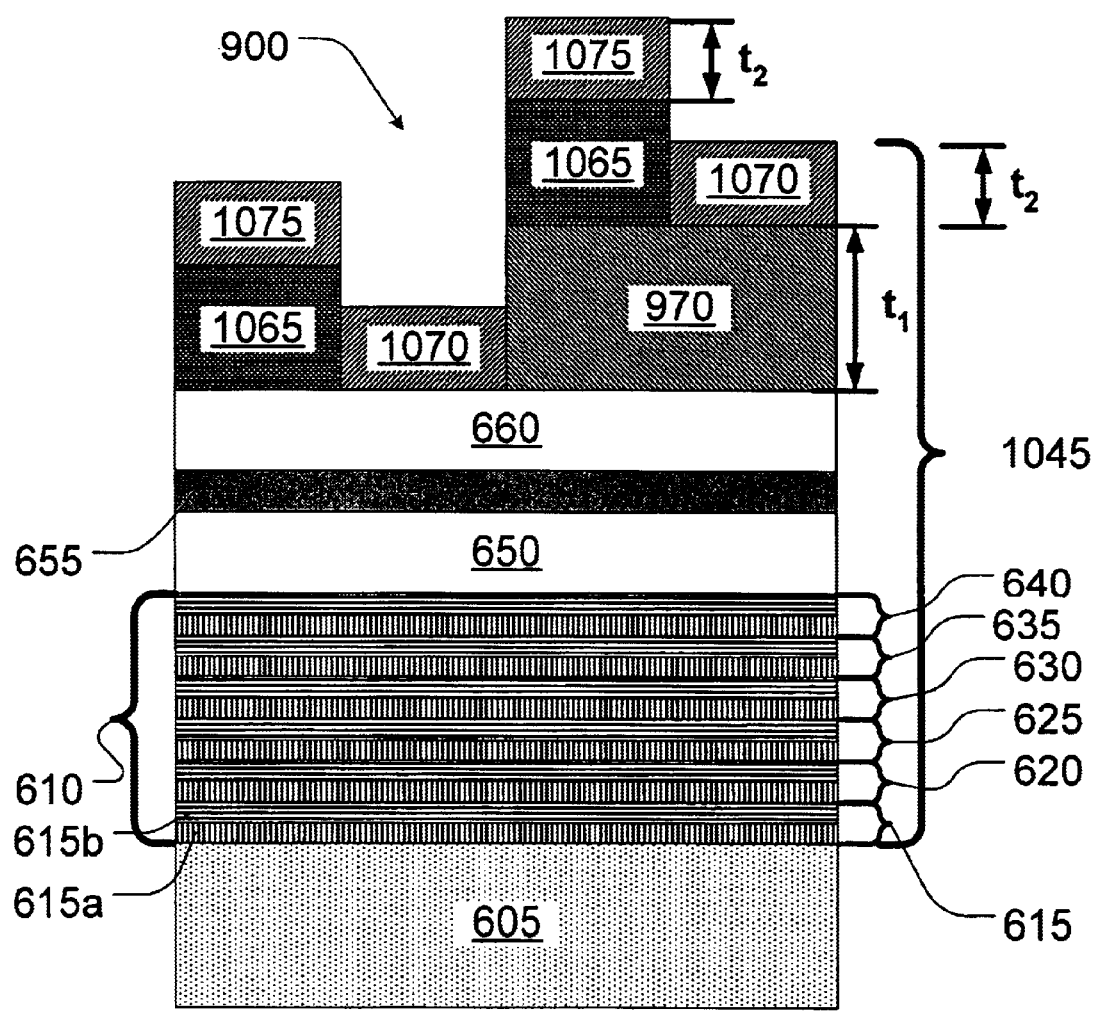

As shown in FIG. 10, an optical cavity 1045 may also comprise a phase shift layer 1070. The phase shift layer 1070 may have a thickness $t_2$ in a range of about 10–1000 Å. The phase shift layer 1070 may be formed using a lithographically patterned masking or lift-off layer 1065 comprising photoresist, for example, capable of being selectively removed with respect to the phase shift layer 1070. The lithographically patterned masking or lift-off layer 1065 may cover about half the area of the upper surface of the vertical cavity surface-emitting laser (VCSEL) structure 900. The lithographically patterned masking or lift-off layer 1065 may comprise a plurality of portions each covering about half the area of each portion of the lithographically patterned masking or lift-off layer 965.

In various illustrative embodiments, for example, the phase shift layer 1070 comprises silicon dioxide ($SiO_2$). The phase shift layer 1070 may comprise a plurality of portions each covering about half the area of each portion of the phase shift layer 970. When the phase shift layer 1070 is formed, a phase shift layer 1075 is also formed on the lithographically patterned masking or lift-off layer 1065 comprising photoresist. When the lithographically patterned masking or lift-off layer 1065 comprising photoresist is removed by being lifted off, for example, the phase shift layer 1075 is also removed, leaving the phase shift layer 1070 formed as a portion of the optical cavity 1045 for at least a portion of the vertical cavity surface-emitting laser (VCSEL) structure 900.

Figure 11:
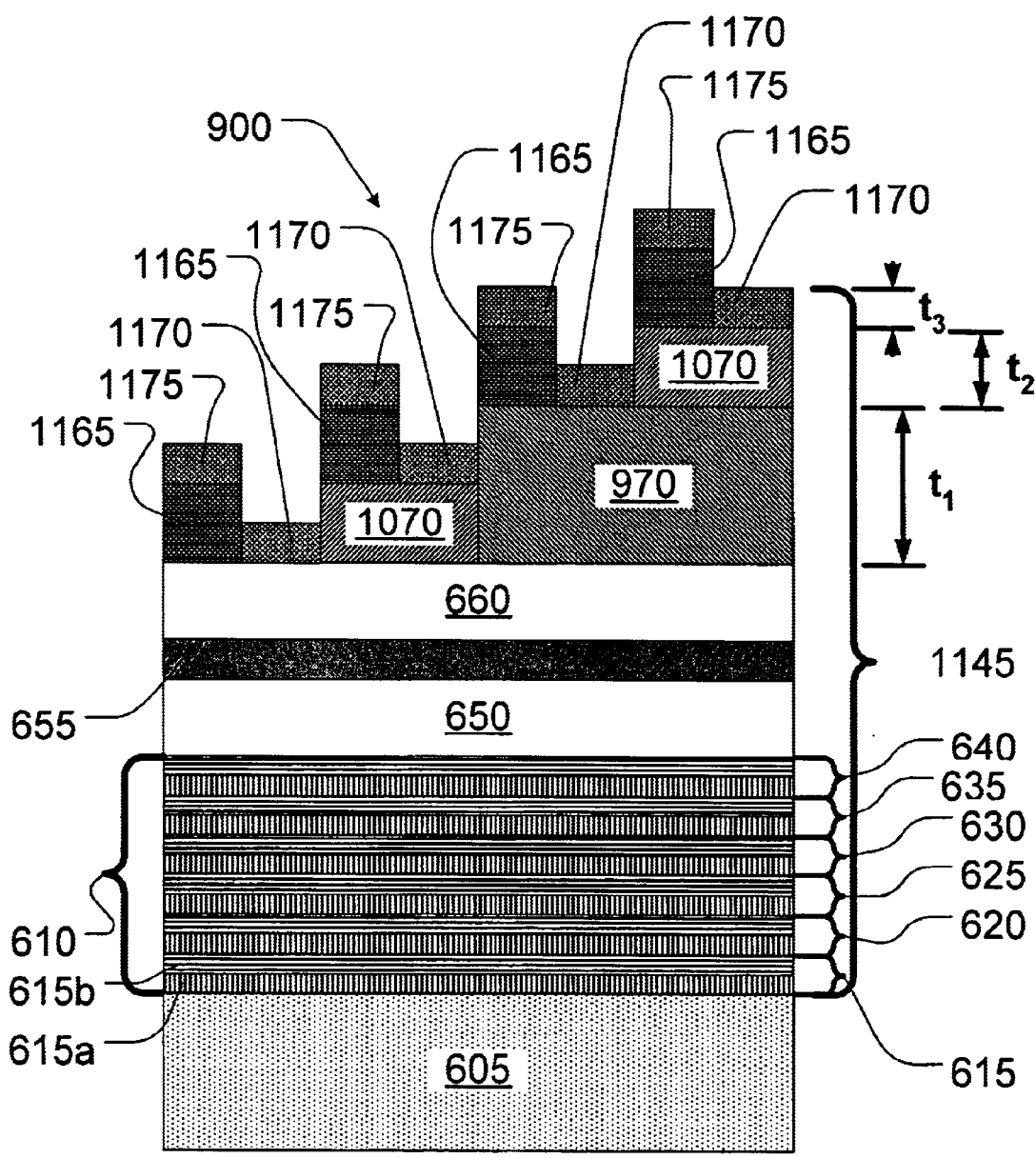

As shown in FIG. 11, an optical cavity 1145 may also comprise a phase shift layer 1170. The phase shift layer 1170 may have a thickness $t_3$ in a range of about 10–1000 Å. The phase shift layer 1170 may be formed using a lithographically patterned masking or lift-off layer 1165 comprising photoresist, for example, capable of being selectively removed with respect to the phase shift layer 1170. The lithographically patterned masking or lift-off layer 1165 may cover about half the area of the upper surface of the vertical cavity surface-emitting laser (VCSEL) structure 900. The lithographically patterned masking or lift-off layer 1165 may comprise a plurality of portions each covering about half the area of each portion of the lithographically patterned masking or lift-off layer 1065.

In various illustrative embodiments, for example, the phase shift layer 1170 comprises silicon dioxide ($SiO_2$). The phase shift layer 1170 may comprise a plurality of portions each covering about half the area of each portion of the phase shift layer 1070. When the phase shift layer 1170 is formed, a phase shift layer 1175 is also formed on the lithographically patterned masking or lift-off layer 1165 comprising photoresist. When the lithographically patterned masking or lift-off layer 1165 comprising photoresist is removed by being lifted off, for example, the phase shift layer 1175 is also removed, leaving the phase shift layer 1170 formed as a portion of the optical cavity 1145 for at least a portion of the vertical cavity surface-emitting laser (VCSEL) structure 900.

The optical cavity 1145 of the vertical cavity surface-emitting laser (VCSEL) structure 900 has 8 different effective optical cavity lengths formed, corresponding to 8 different lasing wavelengths. One effective optical cavity length includes no additional phase shift layer thickness, another effective optical cavity length includes the phase shift layer 1170 having a thickness $t_3$, another effective optical cavity length includes the phase shift layer 1070 having a thickness $t_2$, another effective optical cavity length includes the phase shift layers 1070 and 1170 having a combined thickness $t_2+t_3$, another effective optical cavity length includes the phase shift layer 970 having a thickness $t_1$, another effective optical cavity length includes the phase shift layers 970 and 1170 having a combined thickness $t_1+t_3$, another effective optical cavity length includes the phase shift layers 970 and 1070 having a combined thickness $t_1+t_2$ and another effective optical cavity length includes the phase shift layers 970, 1070 and 1170 having a combined thickness $t_1+t_2+t_3$, corresponding to the 8 different lasing wavelengths for 8 vertical cavity surface-emitting lasers (VCSELs) in a monolithic array. Note that while the 8 vertical cavity surface-emitting lasers (VCSELs) in the monolithic array illustrated in FIG. 11 are linearly arranged, other non-linear geometries are possible, of course, as one of ordinary skill in the art having the benefit of the present disclosure would know.

Finally, an upper vertical cavity surface-emitting laser (VCSEL) structure (not shown) is deposited. The upper vertical cavity surface-emitting laser (VCSEL) structure may include an upper distributed Bragg reflector (DBR) similar to the upper distributed Bragg reflector (DBR) 810, as shown in FIG. 8. The upper distributed Bragg reflector (DBR) may have fewer than the M pairs of layers of the lower distributed Bragg reflector (DBR) 610, each member of each pair having an index of refraction differing from the other member of each pair. In various illustrative embodiments, the number of pairs of layers in the upper distributed Bragg reflector (DBR) may be in a range of about 4 to about 60. The upper distributed Bragg reflector (DBR) may have fewer than M pairs of layers so that the reflectivity of the upper distributed Bragg reflector (DBR) is less than the reflectivity of the lower distributed Bragg reflector (DBR) 610. Equivalently, the transmissivity of the upper distributed Bragg reflector (DBR) is greater than the transmissivity of the lower distributed Bragg reflector (DBR) 610. Consequently, more laser photons are emitted from the upper surface of the vertical cavity surface-emitting laser (VCSEL) structure 900 than into the substrate 605.

In various illustrative embodiments, forming at least n+1 and at most $2^n$ different optical thicknesses for a device, such as a monolithic array of optical devices, using n masking layers and n phase-shift layers, may be accomplished as follows. The n phase-shift layers may have thicknesses $t_1$, $t_2$, K, $t_n$, where $t_1 \geq t_2 \geq L \geq t_{n-1} \geq t_n$. The total number $\theta$ of different optical thicknesses formed using the n phase-shift layers, having thicknesses $t_1$, $t_2$, K, $t_n$ where $t_1=t_2=L=t_{n-1}=t_n$ may be calculated as follows:

$$\theta = \sum_{i=0}^{i=n} i = n+1.$$

The total number $\theta$ of different optical thicknesses formed using the n phase-shift layers, having thicknesses $t_1$, $t_2$, K, $t_n$ where $t_1 > t_2 > L > t_{n-1} > t_n$ and $$t_i > \sum_{j=i+1}^{j=n} t_j$$

for i=1, 2, K, n−2, may be calculated as follows:

$$\theta = \sum_{i=0}^{i=n}\binom{n}{i} = \sum_{i=0}^{i=n}\frac{n!}{i!(n-i)!} = (1+1)^n = 2^n.$$

The total number $\theta$ of different optical thicknesses formed using the n phase-shift layers, having thicknesses $t_1$, $t_2$, K, $t_n$ where $t_1 \geq t_2 \geq L \geq t_{n-1} \geq t_n$, is in the range of $n+1 \leq \theta \leq 2^n$. The n phase-shift layers, having thicknesses $t_1$, $t_2$, K, $t_n$ where $t_1 \geq t_2 \geq L \geq t_{n-1} \leq t_n$, may be formed in any of n!=(n)(n−1)(n−2) L (3)(2)(1) different ways, each corresponding to one of the n! permutations of the order of forming the n phase-shift layers.

The total number of at least $\theta=n+1$ and at most $\theta=2^n$ different optical thicknesses for the optical cavities corresponds to the total number of at least $\theta=n+1$ and at most $\theta=2^n$ different lasing wavelengths of the monolithic vertical cavity surface-emitting laser (VCSEL) array formed using the n phase-shift layers formed by using the n masking layers, as described above. The total number $\theta=2^n$ of different optical thicknesses for the optical cavities also corresponds to the power set (the set of all subsets) of the set of the thicknesses $t_1$, $t_2$, K, $t_n$ of the n phase-shift layers, where $t_1 > t_2 > L > t_{n-1} > t_n$ and $$t_i > \sum_{j=i+1}^{j=n} t_j$$

for i=1, 2, K, n−2, the empty set corresponding to the optical thickness derived using none of the n phase-shift layers for the optical cavities.

In various illustrative embodiments, the n phase-shift layers may have thicknesses $t_1$, $t_2$, K, $t_n$ where $t_1=rt_2>t_2>L>t_{n-1}=rt_n>t_n$ for $r \geq 2$ and $$t_1 = rt_{i+1} = r^2 t_{i+2} = r^{n-i}t_n > \sum_{j=i+1}^{j=n} t_j$$

for $r \geq 2$, since $$\sum_{j=i+1}^{j=n} t_j = t_n \sum_{j=i+1}^{j=n} r^{n-j} = \frac{r^{n-i}-1}{r-1}t_n,$$

for i=1, 2, K, n−2. For example, for r=2, $t_1=2t_2>t_2>L>t_{n-1}=2t_n>t_n$ and $$t_i = 2t_{i+1} = 2^2 t_{i+2} = 2^{n-i}t_n > \sum_{j=i+1}^{j=n} t_j \text{ since}$$

$$\sum_{j=i+1}^{j=n} t_j = t_n \sum_{j=i+1}^{j=n} 2^{n-j} = \frac{2^{n-i}-1}{1}t_n = (2^{n-i}-1)t_n < 2^{n-i}t_n,$$

for i=1, 2, K, n−2. Similarly, for r=3, $t_1=3t_2>t_2>L>t_{n-1}=3t_n>t_n$ and $$t_i = 3t_{i+1} = 3^2 t_{i+2} = 3^{n-i}t_n > \sum_{j=i+1}^{j=n} t_j \text{ since}$$

$$\sum_{j=i+1}^{j=n} t_j = t_n \sum_{j=i+1}^{j=n} 3^{n-j} = \frac{3^{n-i}-1}{2}t_n < 3^{n-i}t_n,$$

for i=1, 2, K, n−2. Likewise, for r=4, $t_1=4t_2>t_2>L>t_{n-1}=4t_n>t_n$ and $$t_i = 4t_{i+1} = 4^2 t_{i+2} = 4^{n-i}t_n > \sum_{j=i+1}^{j=n} t_j \text{ since}$$

$$\sum_{j=i+1}^{j=n} t_j = t_n \sum_{j=i+1}^{j=n} 4^{n-j} = \frac{4^{n-i}-1}{3}t_n < 4^{n-i}t_n,$$

for i=1, 2, K, n−2. Similarly, for r=5, $t_1=5t_2>t_2>L>t_{n-1}=5t_n>t_n$ and $$t_i = 5t_{i+1} = 5^2 t_{i+2} = 5^{n-i}t_n > \sum_{j=i+1}^{j=n} t_j \text{ since}$$

$$\sum_{j=i+1}^{j=n} t_j = t_n \sum_{j=i+1}^{j=n} 5^{n-j} = \frac{5^{n-i}-1}{4}t_n < 5^{n-i}t_n,$$

for i=1, 2, K, n−2. Likewise, for r=10, $t_1=10t_2>t_2>L>t_{n-1}=10t_n>t_n$ and $$t_i = 10t_{i+1} = 10^2 t_{i+2} = 10^{n-i}t_n > \sum_{j=i+1}^{j=n} t_j \text{ since}$$

$$\sum_{j=i+1}^{j=n} t_j = t_n \sum_{j=i+1}^{j=n} 10^{n-j} = \frac{10^{n-i}-1}{9}t_n < 10^{n-i}t_n,$$

for i=1, 2, K, n−2.

In various illustrative embodiments, the total number of at least $\theta=n+1$ and at most $\theta=2^n$ different optical thicknesses for optical cavities of a monolithic vertical cavity surface-emitting laser (VCSEL) array formed using the n phase-shift layers may correspond to the total number of at least $\theta=n+1$ and at most $\theta=2^n$ different lasing wavelengths of the monolithic vertical cavity surface-emitting laser (VCSEL) array formed using the n phase-shift layers. In various alternative illustrative embodiments, the total number of at least $\theta=n+1$ and at most $\theta=2^n$ different optical thicknesses for a monolithic array of optical filters formed using the n phase-shift layers may correspond to the total number of at least $\theta=n+1$ and at most $\theta=2^n$ different filterable wavelengths of the monolithic array of optical filters formed using the n phase-shift layers.

In various other alternative illustrative embodiments, the total number of at least $\theta=n+1$ and at most $\theta=2^n$ different optical thicknesses for a monolithic array of resonant cavity-based optical and opto-electronic devices formed using the n phase-shift layers may correspond to the total number of at least θ=n+1 and at most θ=$2^n$ different resonant modes of the monolithic array of resonant cavity-based optical and opto-electronic devices formed using the n phase-shift layers. In still other various alternative illustrative embodiments, the total number of at least θ=n+1 and at most θ=$2^n$ different optical thicknesses for a monolithic array of resonant cavity photodetectors formed using the n phase-shift layers may correspond to the total number of at least θ=n+1 and at most θ=$2^n$ different detectable resonant modes of the monolithic array of resonant cavity photodetectors formed using the n phase-shift layers.

In various alternative illustrative embodiments, forming $2^n$ different optical thicknesses for a device, such as a monolithic array of optical devices, using n masking layers and n phase-shift layers, may be accomplished as follows. The n phase-shift layers may have thicknesses $t_1, t_2, K, t_n$ where $t_1>t_2>L>t_{n-1}>t_n$ and $$t_1 > \sum_{j=i+1}^{j=n} t_j$$

for i=1, 2, K, n−2. The total number θ of different optical thicknesses for the monolithic array of optical devices formed using the n phase-shift layers, having thicknesses $t_1, t_2, K, t_n$ where $t_1>t_2>L>t_{n-1}>t_n$ and $$t_1 > \sum_{j=i+1}^{j=n} t_j$$

for i=1, 2, K, n−2, may be calculated as follows:

$$\theta = \sum_{i=0}^{i=n}\binom{n}{i} = \sum_{i=0}^{i=n}\frac{n!}{i!(n-i)!} = (1+1)^n = 2^n.$$

By contrast with the conventional Lemoff et al. '699 patent method, described above in the Description of the Related Art, which necessarily requires at least $$\left(\frac{2^n-1}{2}\right)$$

masking steps to produce an array of $2^n$-wavelength vertical cavity surface-emitting lasers (VCSELs), methods according to various illustrative embodiments of the present invention only require n masking steps to produce an array of $2^n$-wavelength vertical cavity surface-emitting lasers (VCSELs). For a large number $2^n$ of wavelengths, whenever n is greater than 2, for example, methods according to various illustrative embodiments of the present invention are less expensive, more manageable, more practical and more efficient and have an increased yield as compared to conventional methods such as the Lemoff et al. '699 patent method.

The tunability of vertical cavity surface-emitting lasers (VCSELs) may desirably be controlled. Various illustrative embodiments of the present invention use a modified reflector structure to control the sensitivity of the resonant wavelength of an optical cavity to the presence of a phase shift layer for wavelength-selectable vertical cavity surface-emitting lasers (VCSELs), photodetectors, and optical filters.

Figure 12:
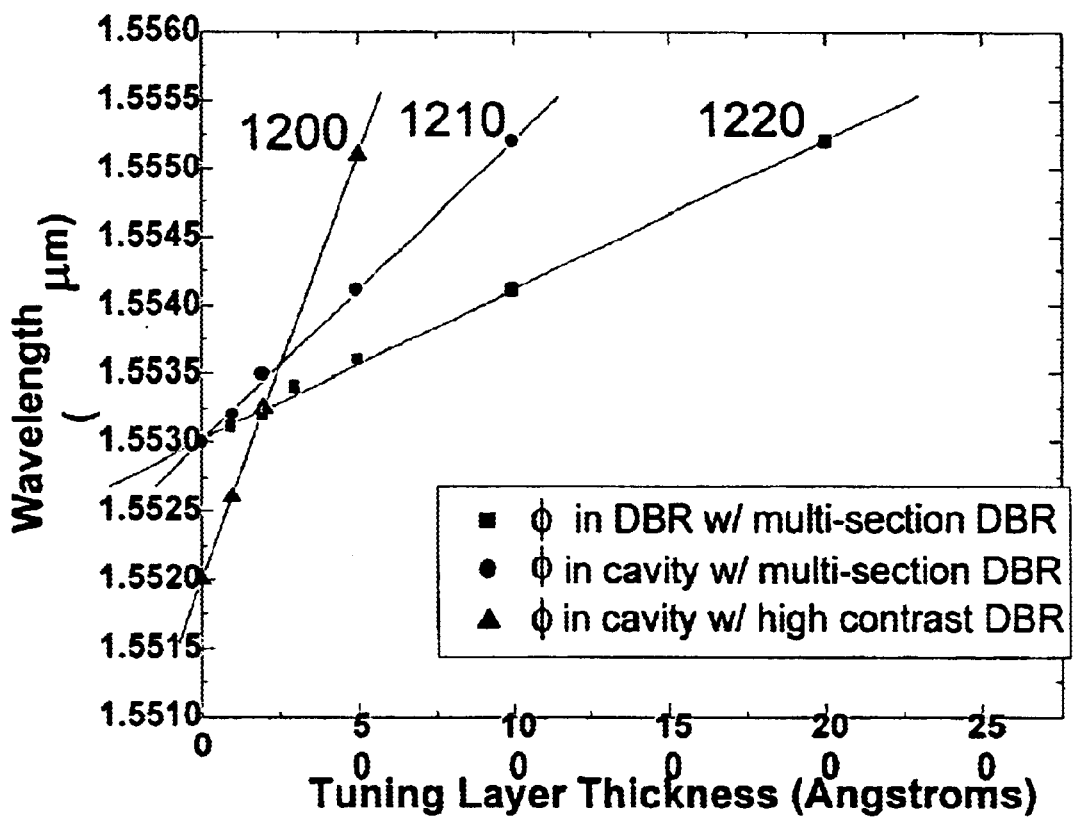

In particular, various illustrative embodiments of the present invention adjust the sensitivity of the optical cavity resonant wavelength by modifying one or more of the distributed Bragg reflectors (DBRs) and/or the location of the wavelength tuning layer within the structure of the optical cavity. For example, the change in wavelength with tuning layer (φ) thickness, and the sensitivity thereto, are as shown in FIG. 12 for different possible structures. As shown, the sensitivity is greater than an order of magnitude different between the structures represented by lines 1200 and 1220. The line 1200 corresponds to a conventional structure 1300 for two vertical cavity surface-emitting lasers (VCSELs) 1340 and 1360 in a monolithic array, as shown in FIG. 13, with distributed Bragg reflector (DBR) sections 610 and 1320, each having pairs 615, 620, 625, 630, 635, 640, 815, 820, 1315, 1325 and 1330 of high refractive index contrast aluminum oxide ($Al_2O_3$) and silicon (Si) layers 615a, 615b, 815a, 815b, 1315a and 1315b, for example.

Figure 13:
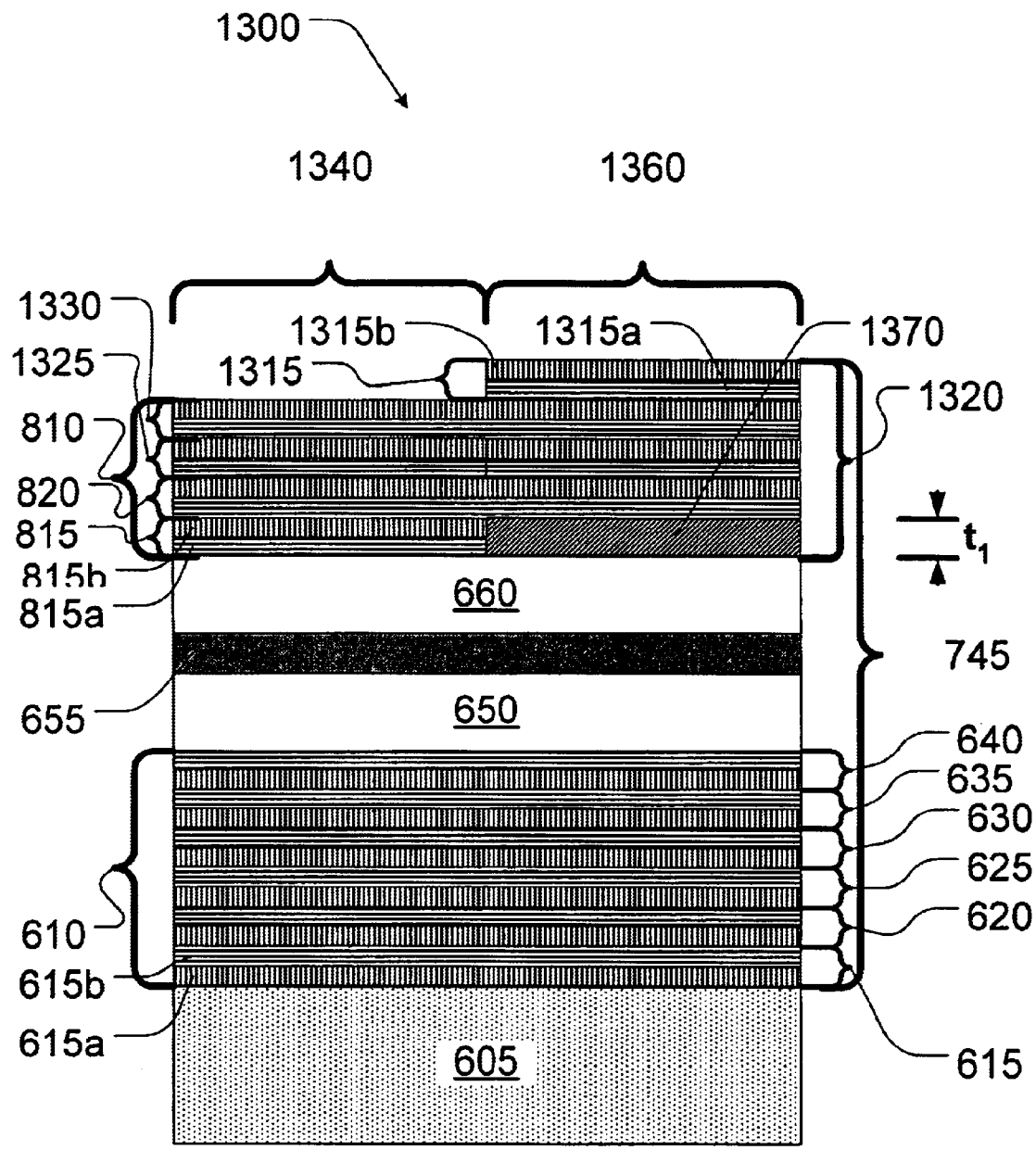

As shown in FIG. 13, a conventional tuning layer 1370 (also known as a phase shift layer 1370) may be disposed at the bottom of the distributed Bragg reflector (DBR) section 1320 between the second intrinsic (non-doped) layer 660 and the pairs 820 of high refractive index contrast aluminum oxide ($Al_2O_3$) and silicon (Si) layers. The tuning layer 1370 may comprise silicon oxide ($SiO_2$). The phase shift layer 1370 may have a thickness $t_1$ in a range of about 10–1000 Å.

Figure 14:
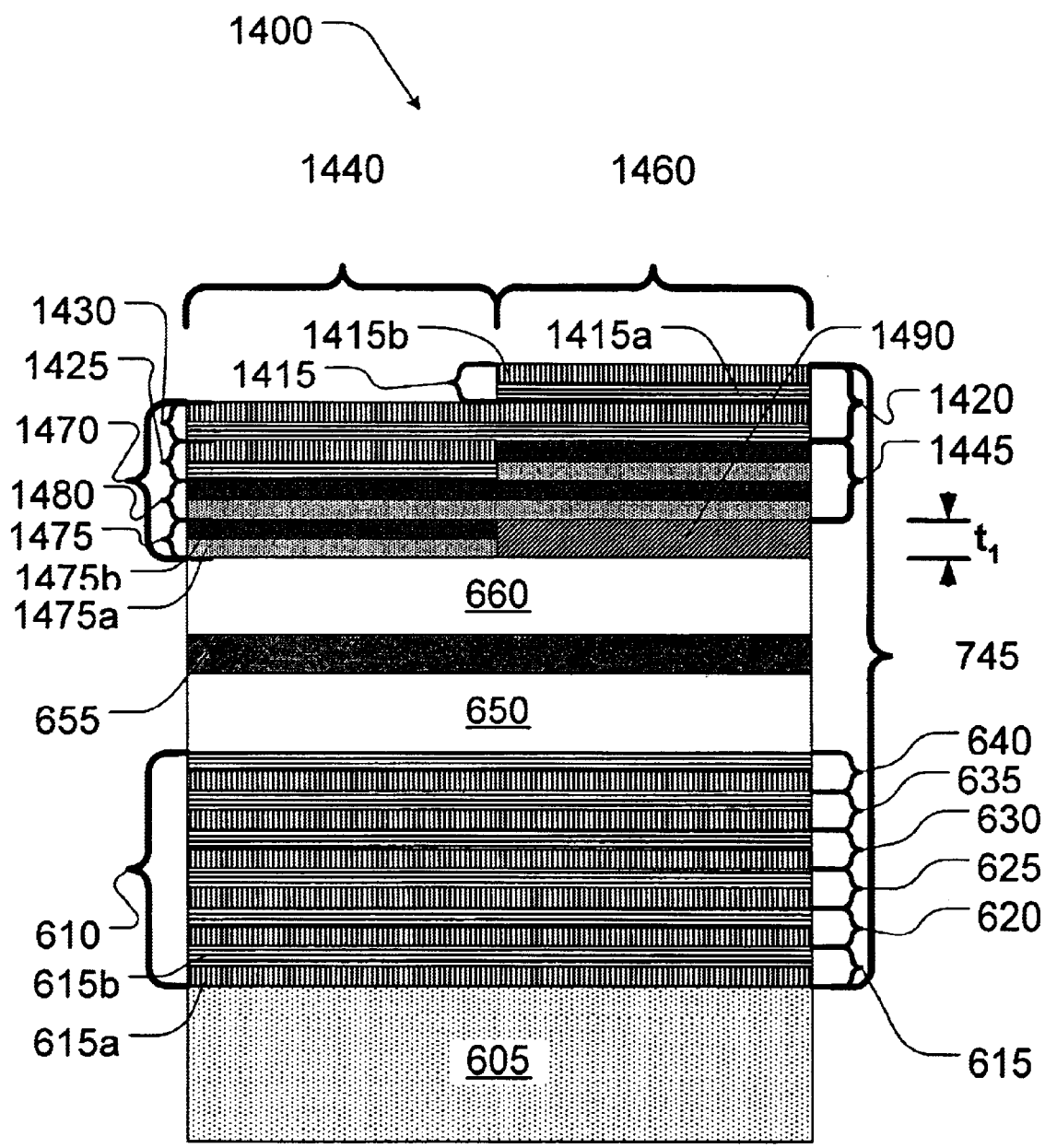

The line 1210 corresponds to various illustrative embodiments of the present invention, schematically illustrating the change and/or tuning of the wavelength with tuning layer thickness, and the sensitivity thereto, for the structure 1400 for two vertical cavity surface-emitting lasers (VCSELs) 1440 and 1460 in a monolithic array, as shown in FIG. 14. The optical cavity 745 may comprise a lower distributed Bragg reflector (DBR) 610 and an upper distributed Bragg reflector (DBR) 1470. The upper distributed Bragg reflector (DBR) 1470 may comprise an inner distributed Bragg reflector (DBR) section 1445 and an outer distributed Bragg reflector (DBR) section 1420. The inner distributed Bragg reflector (DBR) section 1445 may comprise pairs 1475 and 1480 of lower refractive index contrast indium gallium arsenide (InGaAs) and indium aluminum arsenide (InAlAs) layers, such as layers 1475a and 1475b, respectively. The lower distributed Bragg reflector (DBR) 610 and the outer distributed Bragg reflector (DBR) section 1420 may comprise pairs 615, 620, 625, 630, 635, 640, 1425 and 1430, respectively, of higher contrast aluminum oxide ($Al_2O_3$) and silicon (Si) layers, such as layers 615a, 615b, 1415a and 1415b, for example.

As shown in FIG. 14, a tuning layer 1490 (also known as a phase shift layer 1490) may be disposed between the second intrinsic (non-doped) layer 660 and the inner distributed Bragg reflector (DBR) section 1445. The tuning layer 1490 may comprise silicon oxide ($SiO_2$). The phase shift layer 1490 may have a thickness $t_1$ in a range of about 10–1000 Å.

Figure 15:
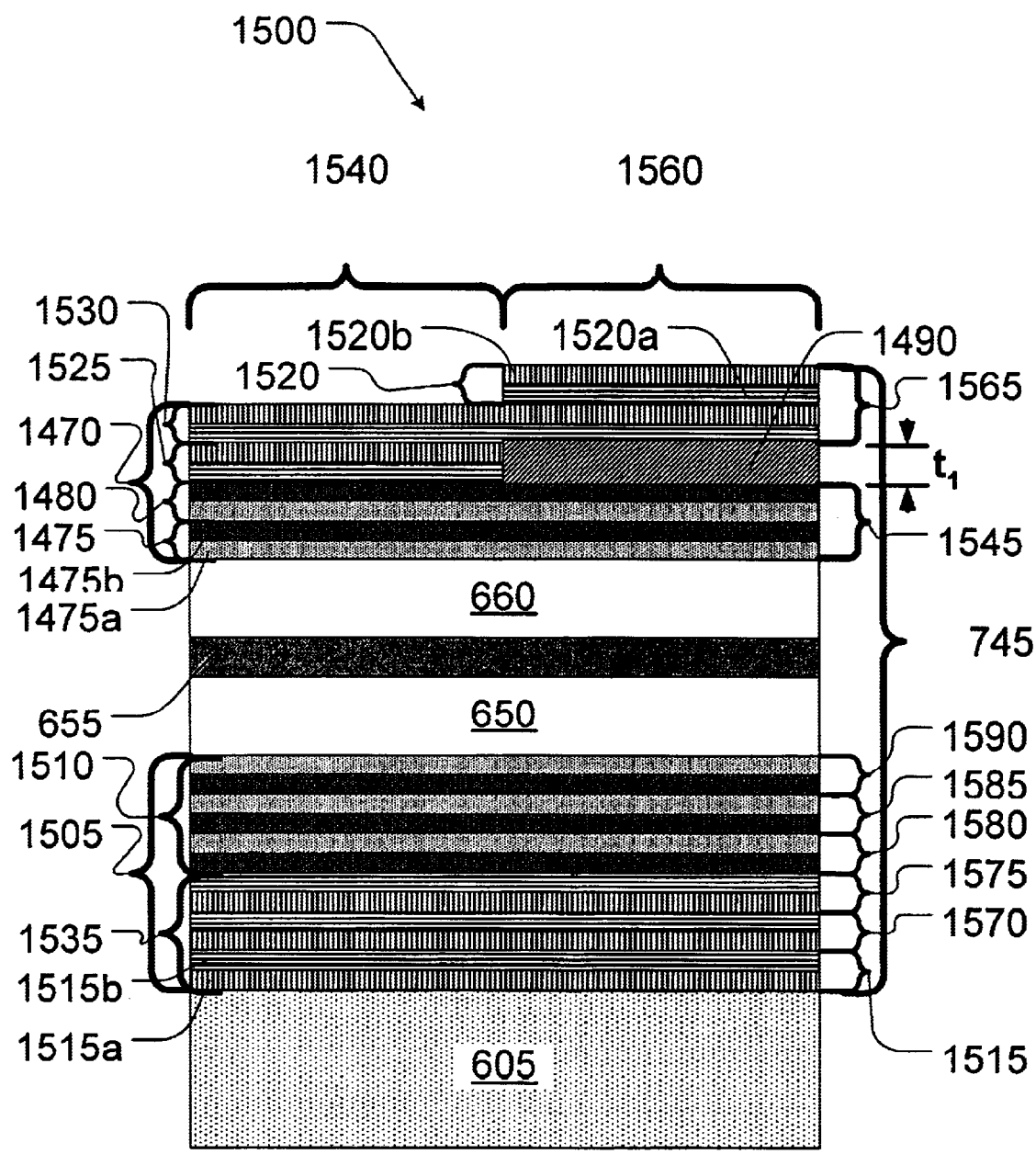

The line 1220 corresponds to various alternative illustrative embodiments of the present invention, schematically illustrating the change and/or tuning of the wavelength with tuning layer thickness, and the sensitivity thereto, for the structure 1500 for two vertical cavity surface-emitting lasers (VCSELs) 1540 and 1560 in a monolithic array, as shown in FIG. 15. The optical cavity 745 may comprise a lower distributed Bragg reflector (DBR) 1505 and an upper distributed Bragg reflector (DBR) 1470. The lower distributed Bragg reflector (DBR) 1505 may comprise an inner distributed Bragg reflector (DBR) section 1510 and an outer distributed Bragg reflector (DBR) section 1535. Similarly, the upper distributed Bragg reflector (DBR) 1470 may comprise an inner distributed Bragg reflector (DBR) section 1545 and an outer distributed Bragg reflector (DBR) section 1565. As shown in FIG. 15, the tuning layer 1490 (also known as the phase shift layer 1490) may be disposed between the inner distributed Bragg reflector (DBR) section 1545 and the outer distributed Bragg reflector (DBR) section 1565. In various illustrative embodiments, the tuning layer 1490 may comprise silicon oxide ($SiO_2$). The phase shift layer 1490 may have a thickness $t_1$ in a range of about 10–1000 Å.

The inner distributed Bragg reflector (DBR) sections 1510 and 1545 may comprise pairs 1580, 1585, 1590, 1475 and 1480 of lower refractive index contrast indium gallium arsenide (InGaAs) and indium aluminum arsenide (InAlAs) layers, such as layers 1475*a* and 1475*b*, respectively. The outer distributed Bragg reflector (DBR) sections 1535 and 1565 may comprise pairs 1515, 1570, 1575, 1525, 1520 and 1530 of higher refractive index contrast aluminum oxide ($Al_2O_3$) and silicon (Si) layers, such as layers 1515*a*, 1515*b*, 1520*a* and 1520*b*, for example.

Figure 16:
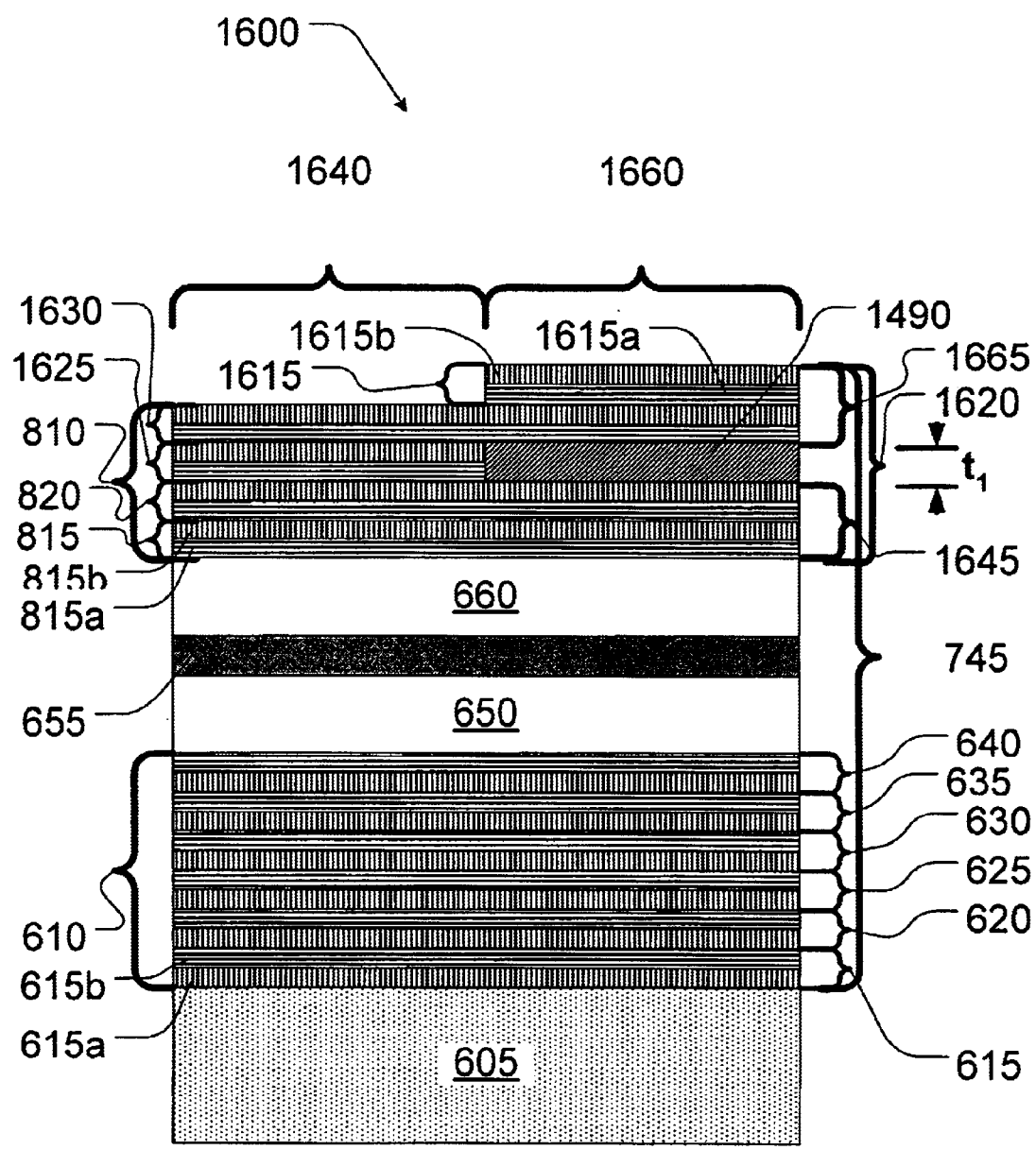

As shown in FIG. 16, structure 1600 may have two vertical cavity surface-emitting lasers (VCSELs) 1640 and 1660 disposed in a monolithic array. The optical cavity 745 may comprise a lower distributed Bragg reflector (DBR) 610 and an upper distributed Bragg reflector (DBR) 1620. The lower distributed Bragg reflector (DBR) 610 may comprise a single section. However, the upper distributed Bragg reflector (DBR) 1620 may comprise an inner distributed Bragg reflector (DBR) section 1645 and an outer distributed Bragg reflector (DBR) section 1665. As shown in FIG. 16, the tuning layer 1490 (also known as the phase shift layer 1490) may be disposed between the inner distributed Bragg reflector (DBR) section 1645 and the outer distributed Bragg reflector (DBR) section 1665. In various illustrative embodiments, the tuning layer 1490 may comprise silicon oxide ($SiO_2$). The tuning layer 1490 may have a thickness $t_1$ in a range of about 10–1000 Å.

The inner distributed Bragg reflector (DBR) section 1645 may comprise pairs 815 and 820 of higher refractive index contrast aluminum oxide ($Al_2O_3$) and silicon (Si) layers, such as layers 815*a* and 815*b*, respectively. The outer distributed Bragg reflector (DBR) sections 610 and 1665 may also comprise pairs 615, 620, 625, 630, 635, 640, 1625, 1630 and 1615 of higher refractive index contrast aluminum oxide ($Al_2O_3$) and silicon (Si) layers, such as layers 615*a*, 615*b*, 1615*a* and 1615*b*, for example.

Figure 17:
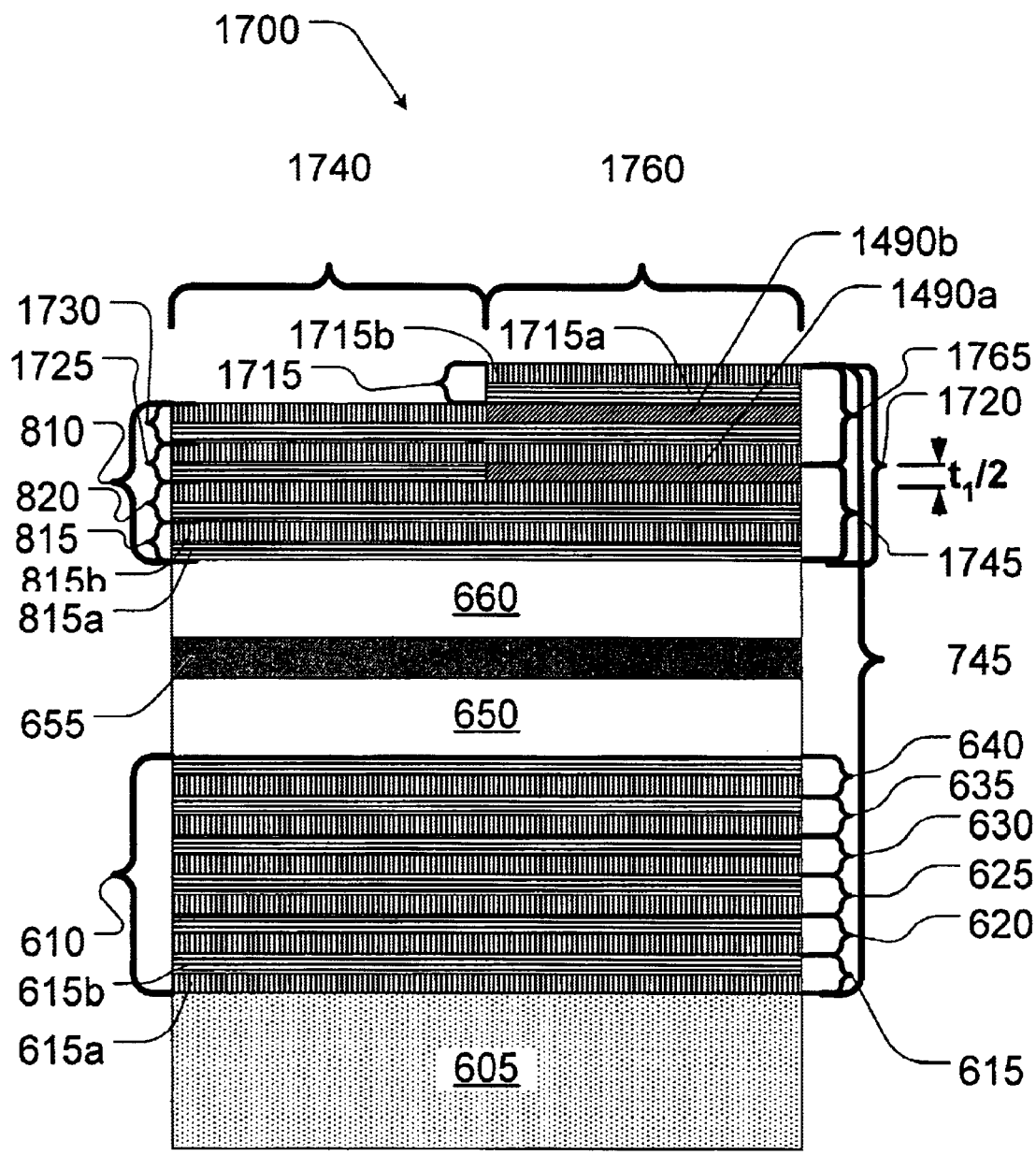

As shown in FIG. 17, structure 1700 may have two vertical cavity surface-emitting lasers (VCSELs) 1740 and 1760 disposed in a monolithic array. The optical cavity 745 may comprise a lower distributed Bragg reflector (DBR) 610 and an upper distributed Bragg reflector (DBR) 1720. The lower distributed Bragg reflector (DBR) 610 may comprise a single section. However, the upper distributed Bragg reflector (DBR) 1720 may comprise an inner distributed Bragg reflector (DBR) section 1745 and an outer distributed Bragg reflector (DBR) section 1765. As shown in FIG. 17, the tuning layer (represented by the tuning layer portions 1490*a* and 1490*b*) may be dispersed and/or smeared out within the inner distributed Bragg reflector (DBR) section 1745 and/or the outer distributed Bragg reflector (DBR) section 1765. In various illustrative embodiments, the tuning layer portions 1490*a* and 1490*b* may comprise silicon oxide ($SiO_2$). The tuning layer portions 1490*a* and 1490*b* may each have a thickness $t_1/2$ in a range of about 10–1000 Å. Similarly, n tuning layer portions may each have a thickness $t_1/n$ in a range of about 10–1000 Å.

The inner distributed Bragg reflector (DBR) section 1745 may comprise pairs 815 and 820 of higher refractive index contrast aluminum oxide ($Al_2O_3$) and silicon (Si) layers, such as layers 815*a* and 815*b*, respectively. The outer distributed Bragg reflector (DBR) sections 610 and 1765 may also comprise pairs 615, 620, 625, 630, 635, 640, 1725, 1730 and 1715 of higher refractive index contrast aluminum oxide ($Al_2O_3$) and silicon (Si) layers, such as layers 615*a*, 615*b*, 1715*a* and 1715*b*, for example.

If the distributed Bragg reflectors (DBRs) have a high refractive index contrast, such as by having silicon (Si) and silicon dioxide ($SiO_2$) layers, to achieve a high reflectivity, then the wavelength may be very sensitive to the thickness of the tuning layer 1490. If the distributed Bragg reflectors (DBRs) have a low refractive index contrast, such as by having indium gallium arsenide (InGaAs) and indium aluminum arsenide (InAlAs) layers, then the wavelength will be less sensitive to the thickness of the tuning layer 1490. However, as described above, it may be difficult with such lower contrast distributed Bragg reflector (DBR) mirrors to achieve the reflectivity required for VCSELs.

Referring now to FIG. 14, various illustrative embodiments are shown for achieving a sensitivity intermediate to the low contrast and high contrast distributed Bragg reflector (DBR) mirrors. If a hybrid mirror is used with several pairs of low contrast distributed Bragg reflector (DBR) section layers and several high contrast pairs of distributed Bragg reflector (DBR) section layers, it may be possible to achieve a tuning sensitivity intermediate to the two single section distributed Bragg reflectors (DBRs) with a reflectivity high enough for VCSEL operation. As shown in FIG. 15, the structure 1500 has the top distributed Bragg reflector (DBR) 1470 and the bottom distributed Bragg reflector (DBR) 1505 that both have two sections 1545, 1565, 1510 and 1515, respectively. The inner distributed Bragg reflector (DBR) section 1545 has pairs 1475 and 1480 of constituent layers, such as 1475*a* and 1475*b*, comprising materials having a lower difference in their refractive indices than for the constituent layers, such as 1520*a* and 1520*b*, of the outer distributed Bragg reflector (DBR) section 1565.

The same is true for the two sections 1510 and 1515 of the bottom distributed Bragg reflector (DBR) 1505, respectively. As shown in FIG. 14, in various illustrative embodiments, only one of the top or the bottom distributed Bragg reflectors (DBRs) may comprise multiple sections. The number of layer pairs in each section also does not need to be the same in all sections.

In various illustrative embodiments, to decrease the sensitivity of the tuning, it is possible to place the tuning layer 1490 between mirror pairs on one of the distributed Bragg reflectors (DBRs), as shown in FIGS. 15 and 16. The top distributed Bragg reflector (DBR) 1470 may comprise multiple sections 1545, 1565, 1645 and 1665, as described above. These sections could be (as shown in FIG. 15), but need not be (as shown in FIG. 16), made of different sets of materials. The number of mirror pairs in each section can be chosen independently. In various illustrative embodiments of the present invention, the inner distributed Bragg reflector (DBR) section 1545 has pairs 1475 and 1480 of constituent layers, such as 1475*a* and 1475*b*, comprising materials such as indium aluminum arsenide (InAlAs) and indium gallium arsenide (InGaAs) having a lower difference in their refractive indices than for the constituent layers, such as 1520*a* and 1520*b*, comprising materials such as aluminum oxide ($Al_2O_3$) and silicon (Si) of the outer distributed Bragg reflector (DBR) section 1565. In various alternative illustrative embodiments, there may be four pairs of layers in each of the distributed Bragg reflector (DBR) sections 1545 and 1565. In various alternative illustrative embodiments, as shown in FIG. 15, the bottom mirror may be similar with section 1510 corresponding to section 1545, and section 1515 corresponding to section 1565. The tuning layer 1490 may be made of a thin layer of silicon dioxide ($SiO_2$). The phase shift layer 1490 may have a thickness $t_1$ in a range of about 10–1000 Å.

Figure 18:
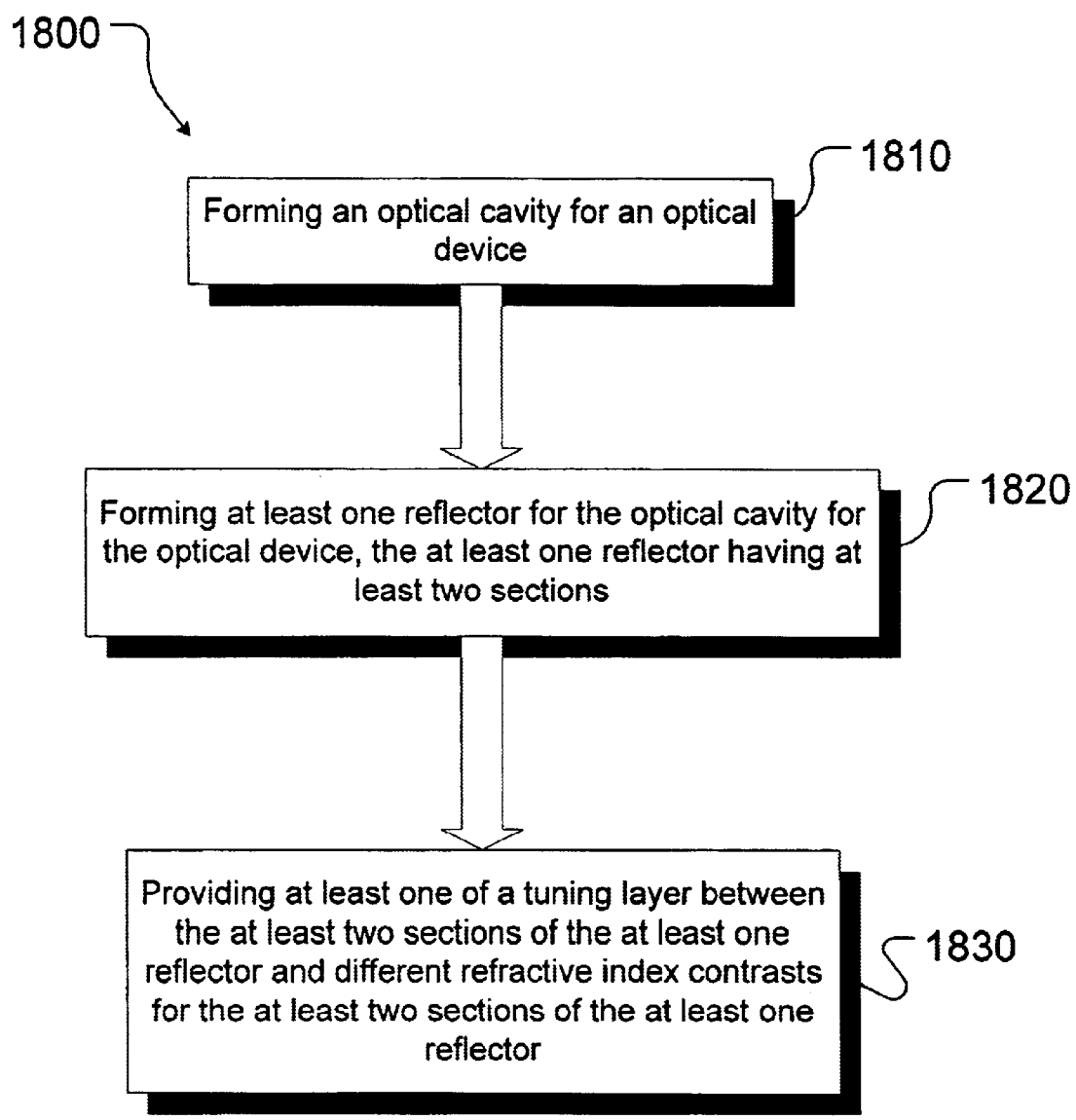

FIG. 18 schematically illustrates a particular embodiment of a method 1800 practiced in accordance with the present invention. FIGS. 12 and 14–17 schematically illustrate various exemplary particular embodiments with which the method 1800 may be practiced. For the sake of clarity, and to further an understanding of the invention, the method 1800 shall be disclosed in the context of the various exemplary particular embodiments shown in FIGS. 12 and 14–17. However, the present invention is not so limited and admits wide variation, as is discussed further below.

As shown in FIG. 18, the method 1800 begins, as set forth in box 1810, by forming an optical cavity for an optical device. For example, the optical cavity 745 may be formed as in the structures 1400, 1500, 1600 and 1700, as shown in FIGS. 14, 15, 16 and 17, respectively.

The method 1800 proceeds, as set forth in box 1820, by forming at least one reflector for the optical cavity for the optical device, the at least one reflector having at least two sections. For example, at least one reflector (such as the reflectors 1470 and 1620, as shown in FIGS. 14, 15 and 16), having at least two sections (such as sections 1420, 1445, 1545, 1565, 1645 and 1665, as shown in FIGS. 14, 15 and 16), may be formed for the optical cavity 745 for the structures 1400, 1500 and 1600, as shown in FIGS. 14, 15 and 16.

The method 1800 proceeds, as set forth in box 1830, by providing at least one of a tuning layer between the at least two sections of the at least one reflector and different refractive index contrasts for the at least two sections of the at least one reflector. For example, the tuning layer 1490 may be provided between the two sections 1545 and 1565 of the reflector 1470 for the VCSEL device 1560, as shown in FIG. 15. Similarly, the tuning layer 1490 may be provided between the two sections 1645 and 1665 of the reflector 1620 for the VCSEL device 1660, as shown in FIG. 16. Alternatively, and/or additionally, different refractive index contrasts may be provided for the two sections 1545 and 1565 of the reflector 1470 for the VCSEL device 1560, as shown in FIG. 15. Similarly, different refractive index contrasts may be provided for the two sections 1445 and 1420 of the reflector 1470 for the VCSEL devices 1440 and 1460, as shown in FIG. 14.

The burgeoning metro telecommunications network has created new challenges for service providers. Many of the illustrative embodiments described above allow the introduction of a multi-wavelength 1.55 µm VCSEL array that will enable equipment manufactures to better meet the needs of service providers. Steadily rising bandwidth demands are driving the expansion of metro networks. However, the economics of the metro network are changing. In today's metro network the price/performance balance is tilting towards lower costs and greater agility, in contrast to the performance-obsessed long-haul network.

Equipment providers have responded to this shift with new lines targeted at the emerging metro arena, but suppliers of optical components, particularly laser transmitter producers, have typically been slow to adapt. They have been unable to deliver an intermediate reach laser at an affordable price. Equipment manufactures have had to choose either expensive high-performance 1.55 µm DFB lasers or cheaper, and less advantageous, wavelengths (i.e. 1.3 µm) and laser technologies (e.g. Fabry-Perot).

The new "C" and "L" band vertical cavity surface-emitting laser (VCSEL) arrays according to many of the illustrative embodiments described above will give equipment manufacturers a new alternative for metro core and edge applications, each laser working at a different ITU wavelength with about 200 GHz spacing. This VCSEL array will help equipment suppliers meet the metro challenge by providing an economical and robust intermediate reach (2–50 km) laser.

VCSEL arrays according to many of the illustrative embodiments described above have a number of advantages. Compared to the incumbent 1.55 µm DFB edge-emitting laser technology, VCSEL arrays according to many of the illustrative embodiments described above are considerably less expensive to produce because they are grown and processed monolithically. Moreover, the ability to make cost effective, multi-wavelength arrays opens technological avenues unavailable to edge-emitting lasers. This innovation promises to significantly reduce equipment costs, giving a significant price advantage to equipment suppliers who can incorporate it into their equipment.

VCSEL arrays according to many of the illustrative embodiments described above reduce equipment costs in two ways. For example, a four-wavelength VCSEL array is less expensive than four DFB lasers. But the VCSEL arrays according to many of the illustrative embodiments described above enable a much large saving beyond simple component costs. Traditionally, each laser in a system resides on one line card, filling one slot in a telecommunications bay. A four-wavelength VCSEL according to many of the illustrative embodiments described above can eliminate the need for three of four line cards, radically expanding the capacity of a telecommunications bay. The four-VCSEL array according to many of the illustrative embodiments described above also is appropriate for applications such as multiprotocol lambda switching (MPLS), routing, optical cross-connects and switching. Higher array counts, higher power levels and/or different spacing options according to many of the illustrative embodiments described above are farther advantages.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below.

What is claimed:

1. An optical device comprising:
    (a) a first reflector comprising:
        (i) a plurality of mirror pairs each comprising a pair of layers, each layer of each mirror pair having an index of refraction different than that of the other layer of the respective mirror pair; and
        (ii) a tuning layer disposed therein, the tuning layer having an index of refraction different from that of the layers of the mirror pairs of the first reflector, wherein:

the tuning layer is a single tuning layer disposed between two mirror pairs of the first reflector;

the difference in refractive index for each mirror pair of the first reflector defines a refractive index contrast for the respective mirror pair; and the mirror pairs of the plurality of mirror pairs on one side of the tuning layer have a first refractive index contrast and the other mirror pairs of the plurality of mirror pairs have a second refractive index contrast different than the first refractive index contrast, wherein the mirror pairs on said one side of the tuning layer comprise pairs of $Al_2O_3$ and Si, the other mirror pairs comprise pairs of InGaAs and InAlAs and the tuning layer consists of $SiO_2$;

(b) a second reflector; and (c) an optical cavity defined by the first and second reflectors.

2. The optical device of claim 1, wherein the first reflector is a distributed Bragg reflector (DBR) having the tuning layer disposed therein.

3. The optical device of claim 1, wherein the tuning layer has a thickness in the range of about 10 Å to 1000 Å.

4. The optical device of claim 3, wherein the optical device is one of a vertical-cavity surface-emitting laser (VCSEL), an optical filter, a resonant cavity-based optical device, a resonant cavity-based opto-electronic device, and a resonant cavity-enhanced photodetector.

5. The optical device of claim 3, wherein the optical device is a VCSEL, the optical device further comprising an optical gain layer disposed in said optical cavity, between said first and second reflectors, the active region containing a material that is capable of stimulated emission at one or more wavelengths of light.

6. The optical device of claim 1, wherein the tuning layer has a thickness in the range of about 10 Å to 1000 Å.

7. The optical device of claim 1, wherein the optical device is one of a VCSEL, an optical filter, a resonant cavity-based optical device, a resonant cavity-based opto-electronic device, and a resonant cavity-enhanced photodetector.

8. The optical device of claim 1, wherein the optical device is a VCSEL, the optical device further comprising an optical gain layer disposed in said optical cavity, between said first and second reflectors, the active region containing a material that is capable of stimulated emission at one or more wavelengths of light.

9. A VCSEL comprising:

(a) a first reflector comprising:

(i) a plurality of mirror pairs each comprising a pair of layers of $Al_2O_3$ and Si, each layer of each mirror pair having an index of refraction different than that of the other layer of the respective mirror pair; and (ii) a tuning layer consisting of $SiO_2$ disposed therein, the tuning layer having an index of refraction different from that of the layers of the mirror pairs of the first reflector, wherein the tuning layer is a single tuning layer disposed between two mirror pairs of the first reflector and having a thickness in the range of about 10 Å to 1000 Å;

(b) a second reflector comprising a plurality of mirror pairs each comprising a pair of layers, each layer of each mirror pair having an index of refraction different than that of the other layer of the respective mirror pair;

(c) an optical cavity defined by the first and second reflectors; and (d) an optical gain layer disposed in said optical cavity, between said first and second reflectors, the active region containing a material that is capable of stimulated emission at one or more wavelengths of light.

10. The VCSEL of claim 9, wherein the first reflector is a distributed Bragg reflector (DBR) having the tuning layer disposed therein.

11. The VCSEL of claim 9, wherein:

the difference in refractive index for each mirror pair of the first reflector defines a refractive index contrast for the respective mirror pair, the mirror pairs of the plurality of mirror pairs an one side of the tuning layer have a first refractive index contrast and the other mirror pairs of the plurality of mirror pairs have a second refractive index contrast different than the first refractive index contrast.

12. An optical device comprising:

(a) a first reflector comprising:

(i) a plurality of mirror pairs each comprising a pair of layers of $Al_2O_3$ and Si, each layer of each mirror pair having an index of refraction different than that of the other layer of the respective mirror pair, and (ii) a tuning layer consisting of $SiO_2$ disposed therein, the tuning layer having an index of refraction different from that of the layers of the mirror pairs of the first reflector, wherein the tuning layer is a single tuning layer disposed between two mirror pairs of the first reflector and having a thickness in the range of about 10 Å to 1000 Å;

(b) a second reflector; and (c) an optical cavity defined by the first and second reflectors.

13. The optical device of claim 12, wherein the first reflector is a distributed Bragg reflector (DBR) having the tuning layer disposed therein.

14. A VCSEL comprising:

(a) a first reflector comprising:

(i) a plurality of mirror pairs each comprising a pair of layers of $Al_2O_3$ and Si, each layer of each mirror pair having an index of refraction different than that of the other layer of the respective mirror pair; and (ii) a tuning layer consisting of $SiO_2$ disposed therein, the tuning layer having a thickness in the range of about 10 Å to 1000 Å and having an index of refraction different from that of the layers of the mirror pairs of the first reflector, wherein:

the tuning layer is a single tuning layer disposed between two mirror pairs of the first reflector;

the difference in refractive index for each mirror pair of the first reflector defines a refractive index contrast for the respective mirror pair; and the mirror pairs of the plurality of mirror pairs on one side of the tuning layer have a first refractive index contrast and the other mirror pairs of the plurality of mirror pairs have a second refractive index contrast different than the first refractive index contrast;

(b) a second reflector comprising a plurality of mirror pairs each comprising a pair of layers, each layer of each mirror pair having an index of refraction different than that of the other layer of the respective mirror pair; and (c) an optical cavity defined by the first and second reflectors; and (d) an optical gain layer disposed in said optical cavity, between said first and second reflectors, the active region containing a material that is capable of stimulated emission at one or more wavelengths of light.

15. The VCSEL of claim 14, wherein the mirror pairs on said one side of the tuning layer comprise pairs of $Al_2O_3$ and Si and the other mirror pairs comprise pairs of InGaAs and InAlAs.

16. The VCSEL of claim 14, wherein the first reflector is a distributed Bragg reflector (DBR) having the tuning layer disposed therein.

17. A VCSEL comprising:
   (a) a first reflector comprising:
      (i) a plurality of mirror pairs each comprising a pair of layers, each layer of each mirror pair having an index of refraction different than that of the other layer of the respective mirror pair; and
      (ii) a tuning layer disposed therein, the tuning layer having an index of refraction different from that of the layers of the mirror pairs of the first reflector, wherein:
         the tuning layer is a single tuning layer disposed between two mirror pairs of the first reflector,
         the difference in refractive index for each mirror pair of the first reflector defines a refractive index contrast for the respective mirror pair;
         the mirror pairs of the plurality of mirror pairs on one side of the tuning layer have a first refractive index contrast and the other mirror pairs of the plurality of mirror pairs have a second refractive index contrast different than the first refractive index contrast; and
         the mirror pairs on said one side of the tuning layer comprise pairs of $Al_2O_3$ and Si, the other mirror pairs comprise pairs of InGaAs and InAlAs, and the tuning layer consists of $SiO_2$;
   (b) a second reflector comprising a plurality of mirror pairs each comprising a pair of layers, each layer of each mirror pair having an index of refraction different than that of the other layer of the respective mirror pair; and
   (c) an optical cavity defined by the first and second reflectors; and
   (d) an optical gain layer disposed in said optical cavity, between said first and second reflectors, the active region containing a material that is capable of stimulated emission at one or more wavelengths of light.

18. The VCSEL of claim 17, wherein the first reflector is a distributed Bragg reflector (DBR) having the tuning layer disposed therein.

19. The VCSEL of claim 17, wherein the tuning layer has a thickness in the range of about 10 Å to 1000 Å.

* * * * *